US011639025B2

(12) United States Patent
He et al.

(10) Patent No.: US 11,639,025 B2
(45) Date of Patent: May 2, 2023

(54) METHODS FOR PHOTO-INDUCED METAL PRINTING

(71) Applicant: The Regents of the University of California, Oakland, CA (US)

(72) Inventors: Ximin He, Los Angeles, CA (US); Xingyun Yang, Los Angeles, CA (US); Dong Wu, Oakland, CA (US); Mutian Hua, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 144 days.

(21) Appl. No.: 17/045,036

(22) PCT Filed: Apr. 3, 2019

(86) PCT No.: PCT/US2019/025657
§ 371 (c)(1),
(2) Date: Oct. 2, 2020

(87) PCT Pub. No.: WO2019/195473
PCT Pub. Date: Oct. 10, 2019

(65) Prior Publication Data
US 2021/0146610 A1 May 20, 2021

Related U.S. Application Data

(60) Provisional application No. 62/652,245, filed on Apr. 3, 2018.

(51) Int. Cl.
*B29C 64/124* (2017.01)
*B29C 64/314* (2017.01)
(Continued)

(52) U.S. Cl.
CPC .......... *B29C 64/124* (2017.08); *B29C 64/245* (2017.08); *B29C 64/255* (2017.08);
(Continued)

(58) Field of Classification Search
CPC ... B29C 64/124; B29C 64/245; B29C 64/255; B29C 64/268; B29C 64/286; B29C 64/314
See application file for complete search history.

(56) References Cited

U.S. PATENT DOCUMENTS 3,754,914 A   8/1973   Inoue et al.
4,780,177 A   10/1988  Wojnarowski et al.
(Continued)

FOREIGN PATENT DOCUMENTS

WO   WO-2017074397 A1 *  5/2017  ............. B22F 3/008
WO   2019195473 A2      10/2019
WO   2019195473 A3      8/2020

OTHER PUBLICATIONS

Wikipedia contributors. (Mar. 10, 2022). Dip-coating. In Wikipedia, The Free Encyclopedia. Retrieved 02:03, Apr. 21, 2022, from https://en.wikipedia.org/w/index.php?title=Dip-coating&oldid=1076371502 (Year: 2022).*

(Continued)

*Primary Examiner* — Michael M. Robinson
(74) *Attorney, Agent, or Firm* — KPPB LLP

(57) ABSTRACT

Methods and apparatus for fabricating high-resolution thin-layer metal patterns and 3D Metal structures are provided. The methods and apparatus operate via photo-(stereo)lithography at room temperature. The printed metal patterns, for example silver patterns, exhibit high electrical conductivity, comparable to or better than the conductivity of the silver printed by current laser sintering or thermal annealing at high temperature.

19 Claims, 20 Drawing Sheets
(17 of 20 Drawing Sheet(s) Filed in Color)

(51) Int. Cl.

| | | |
|---|---|---|
| *B29C 64/245* | (2017.01) | |
| *B29C 64/255* | (2017.01) | |
| *B29C 64/286* | (2017.01) | |
| *B29C 64/268* | (2017.01) | |
| *B33Y 10/00* | (2015.01) | |
| *B33Y 30/00* | (2015.01) | |
| *B33Y 70/00* | (2020.01) | |
| *B33Y 80/00* | (2015.01) | |
| *B33Y 40/10* | (2020.01) | |
| *B29K 67/00* | (2006.01) | |
| *B29L 31/34* | (2006.01) | |

(52) U.S. Cl.
CPC .......... *B29C 64/268* (2017.08); *B29C 64/286* (2017.08); *B29C 64/314* (2017.08); *B29K 2067/003* (2013.01); *B29L 2031/3425* (2013.01); *B33Y 10/00* (2014.12); *B33Y 30/00* (2014.12); *B33Y 40/10* (2020.01); *B33Y 70/00* (2014.12); *B33Y 80/00* (2014.12)

(56) References Cited

U.S. PATENT DOCUMENTS

| | | |
|---|---|---|
| 9,587,315 B2 | 3/2017 | Shukla et al. |
| 2011/0192633 A1 | 8/2011 | Allemand |
| 2015/0013764 A1* | 1/2015 | Matsumura .............. C09D 7/70 252/514 |
| 2016/0167018 A1* | 6/2016 | Shukla ................. C09D 11/101 502/159 |
| 2016/0243649 A1* | 8/2016 | Zheng ................... B29C 64/153 |
| 2017/0233541 A1 | 8/2017 | Wu et al. |
| 2018/0044543 A1* | 2/2018 | Shukla .................... C23C 18/08 |

OTHER PUBLICATIONS

International Preliminary Report on Patentability for International Application PCT/US2019/025657, Report dated Oct. 6, 2020, dated Oct. 15, 2020, 6 pgs.
International Search Report and Written Opinion for International Application No. PCT/US2019/025657, Search completed Jun. 5, 2019, dated Jun. 25, 2020, 12 Pgs.
Asoh et al., "Metal patterning on silicon surface by site-selective electroless deposition through colloidal crystal templating", Journal of Colloid and Interface Science, vol. 316, No. 2, Dec. 15, 2007, pp. 547-552.
Fantino et al., "3D Printing of Conductive Complex Structures with In Situ Generation of Silver Nanoparticles", Advanced Materials, vol. 28, No. 19, Mar. 16, 2016, pp. 3712-3717.
Gorissen et al., "Elastic Inflatable Actuators for Soft Robotic Applications", Advanced Materials, vol. 29, No. 43, Sep. 26, 2017, 1604977, 28 pgs.
Grouchko et al., "Conductive Inks with a "Built-In" Mechanism That Enables Sintering at Room Temperature", ACS Nano, vol. 5, No. 4, Mar. 25, 2011, pp. 3354-3359.
Hyun et al., "Screen Printing of Highly Loaded Silver Inks on Plastic Substrates Using Silicon Stencils", ACS Applied Materials & Interfaces, vol. 7, No. 23, Jun. 2, 2015, pp. 12619-12624.
Lan et al., "Direct Silver Micro Circuit Patterning on Transparent Polyethylene Terephthalate Film Using Laser-Induced Photothermochemical Synthesis", Micromachines, vol. 8, No. 2, Feb. 13, 2017, 52, 10 pgs.
Robertson et al., "Schottky barrier heights of tantalum oxide, barium strontium titanate, lead titanate, and strontium bismuth tantalate", Applied Physics Letters, vol. 74, No. 8, Feb. 18, 1999, pp. 1168-1170.
Yeo et al., "Next Generation Non-Vacuum, Maskless, Low Temperature Nanoparticle Ink Laser Digital Direct Metal Patterning for a Large Area Flexible Electronics", PLoS One, vol. 7, No. 8, Aug. 10, 2012, e42315, 9 pgs.
Zhao et al., "Aminosilanization Nanoadhesive Layer for Nanoelectric Circuits with Porous Ultralow Dielectric Film", ACS Applied Materials & Interfaces, vol. 5, No. 13, Jun. 9, 2013, pp. 6097-6107.

* cited by examiner

METHODS FOR PHOTO-INDUCED METAL PRINTING

CROSS-REFERENCE TO RELATED APPLICATIONS

The present application is a national stage of PCT Patent Application No. PCT/US2019/025657, entitled "Methods for Photo-Induced Metal Printing" to He et al., filed Apr. 3, 2019, which claims the benefit of and priority under 35 U.S.C. § 119(e) to U.S. Provisional Patent Application No. 62/652,245 entitled "Methods for Photo-Induced Metal Printing" to He et al., filed Apr. 3, 2018, the disclosures of which are incorporated herein by reference in their entireties.

FIELD OF THE INVENTION

The present disclosure relates to methods and apparatus for fabricating high-resolution thin-layer metal patterns, and more particularly to metal printing via photo-(stereo)lithography at room temperature.

BACKGROUND OF THE INVENTION

Metal patterning has attracted considerable attention because of its potential application in magnetic, electronic, and optoelectronic devices. (See, e.g., Asoh, H., S. Sakamoto, and S. Ono, *Journal of Colloid and Interface Science*, 2007. 316(2): p. 547-552, the disclosure of which is incorporated herein by reference.) For example, organic field effect transistor (OFET) arrays on a flexible substrate were fabricated from direct metal patterning method wherein solution-deposited metal nanoparticles were selectively sintered by applying a raster scanning focused laser to pattern metal electrode on a polymer substrate. (See, e.g., Yeo, J., et al., *PLoS One*, 2012. 7(8): p. e42315, the disclosure of which is incorporated herein by reference.)

Current techniques rely on three main approaches to achieve metal patterning. One approach utilizes a physical mask with pre-designed patterns. The metal particles are deposited onto desired regions of the substrate through the hollow regions of the mask to form the patterns. Often the generation of metal particles relies on sputtering and evaporating from a metal target or source onto the substrate, which requires vacuum in the depositing chambers. Furthermore, the introduction of a physical mask complicates and slows down the manufacturing process. Additionally, many different masks are required to fabricate different patterns, which creates inconvenience and redundancy.

Another approach is inkjet printing, which has become popular over the past few decades. Inkjet printing uses a computer-controlled nozzle that extrudes ink onto designed regions. Such direct ink writing (DIW) method creates patterns in serial, which is inefficient and energy consuming. In addition, viscous inks are always required to keep the shape of extruded ink filaments in order to maintain the resolution of patterns. However, the use of such viscous ink often leads to clogging of the nozzle and malfunction of the device.

The last approach is selective laser sintering (SLS). For this method, a thin layer of metal powder is placed on a substrate and a laser is used as the heat source to provide enough energy for sintering the metal powders to make them bind together and form dense structures. However, because the laser generates heat directly on the thin layer of metal powder and also on the substrate, the choices of substrate are significantly limited and materials with low glass transition temperature (Tg) have to be avoided Thus, the SLS method has low compatibility with various substrate materials and limits the development of multi-material printing.

SUMMARY OF THE INVENTION

The present disclosure provides embodiments of methods and apparatus for fabricating high-resolution thin-layer metal patterns, and more particularly to metal printing via photo-(stereo)lithography at room temperature.

In one embodiment, A method for printing metal patterns includes immersing a substrate into a photosensitive metal ink having a solution of metal ions disposed therein and focusing an emission of a light source through a light patterning structure onto at least a portion of the substrate such that a patterned design of light is projected thereon, where the emission has a wavelength such that a metal ion reduction reaction is initiated in the photosensitive metal ink at the portion of the substrate onto which the patterned design of light is projected such that the metal ink is decomposed to form and dispose a metal pattern on the substrate, and the metal pattern being identical in conformation to the patterned design of light.

In a further embodiment, the light source is one of either monochromatic or polychromatic and spans a specified wavelength range of light.

In another embodiment, the light patterning structure is selected from the group consisting of a projector, a digital micromirror device (DMD), liquid-crystal display (LCD), and a digital light processing (DLP) apparatus.

In a still further embodiment, the method further includes one or more optical elements disposed between the light source and the substrate selected from the group consisting of light convergent, divergent, and collimating elements.

In still another embodiment, the photosensitive metal ink is one or more organic or inorganic metal salts decomposable to form a metal element under the exposure of the emission.

In a yet further embodiment, the photosensitive metal ink is selected from the group of silver citrate, silver acetate, and modified Tollens' reagent.

In yet another embodiment, the photosensitive metal ink further comprises an additive component disposed within the photosensitive metal ink selected from the group of inorganic salts, and silver nanoseeds.

In a further embodiment again, the substrate is polyethylene terephthalate.

In another embodiment again, the substrate is pretreated with aminopropyltriethoxysilane.

In a further additional embodiment, the method further includes annealing the metal pattern is using a material selected from the group of calcium chloride, calcium nitrate, sodium chloride, and sodium nitrate.

In another additional embodiment, the metal is silver.

In a still yet further embodiment, an apparatus for printing metal patterns includes a substrate, a light source for producing an emission, a light patterning structure in optical alignment between the light source and the substrate such that the emission forms a patterned design of light on the substrate, and a reservoir of a photosensitive metal ink having a solution of metal ions disposed therein in moving relation relative to the substrate such that at least the portion of the substrate having the patterned design of light projected thereon is immersible within the reservoir, where the emission has a wavelength such that when the substrate is immersed in the reservoir a metal ion reduction reaction is initiated in the photosensitive metal ink at the portion of the substrate onto which the patterned design of light is projected such that the metal ink is decomposed to form and dispose a metal pattern on the substrate, the metal pattern being identical in conformation to the patterned design of light.

In still yet another embodiment, the light source is one of either monochromatic or polychromatic and spans a specified wavelength range of light.

In a still further embodiment again, the light patterning structure is selected from the group consisting of a projector, a digital micromirror device (DMD), liquid-crystal display (LCD), and a digital light processing (DLP) apparatus.

In still another embodiment again, the apparatus further includes one or more optical elements disposed between the light source and the substrate selected from the group consisting of light convergent, divergent, and collimating elements.

In a still further additional embodiment, the photosensitive metal ink is one or more organic or inorganic metal salts decomposable to form a metal element under the exposure of the emission.

In still another additional embodiment, the photosensitive metal ink is selected from the group of silver citrate, silver acetate, and modified Tollens' reagent.

In a yet further embodiment again, the photosensitive metal ink further comprises an additive component disposed within the photosensitive metal ink selected from the group of inorganic salts, and silver nanoseeds.

In yet another embodiment again, the substrate is polyethylene terephthalate.

In a yet further additional embodiment, the substrate is pretreated with aminopropyltriethoxysilane.

In yet another additional embodiment, the metal is silver.

Additional embodiments and features are set forth in part in the description that follows, and in part will become apparent to those skilled in the art upon examination of the specification or may be learned by the practice of the disclosed subject matter. A further understanding of the nature and advantages of the present disclosure may be realized by reference to the remaining portions of the specification and the drawings, which forms a part of this disclosure.

BRIEF DESCRIPTION OF THE DRAWINGS

Color Drawings

The patent or application file contains at least one drawing executed in color. Copies of this patent or patent application publication with color drawing(s) will be provided by the Office upon request and payment of the necessary fee.

The description and claims will be more fully understood with reference to the following figures and data graphs, which are presented as exemplary embodiments of the invention and should not be construed as a complete recitation of the scope of the invention.

Figure 1A:
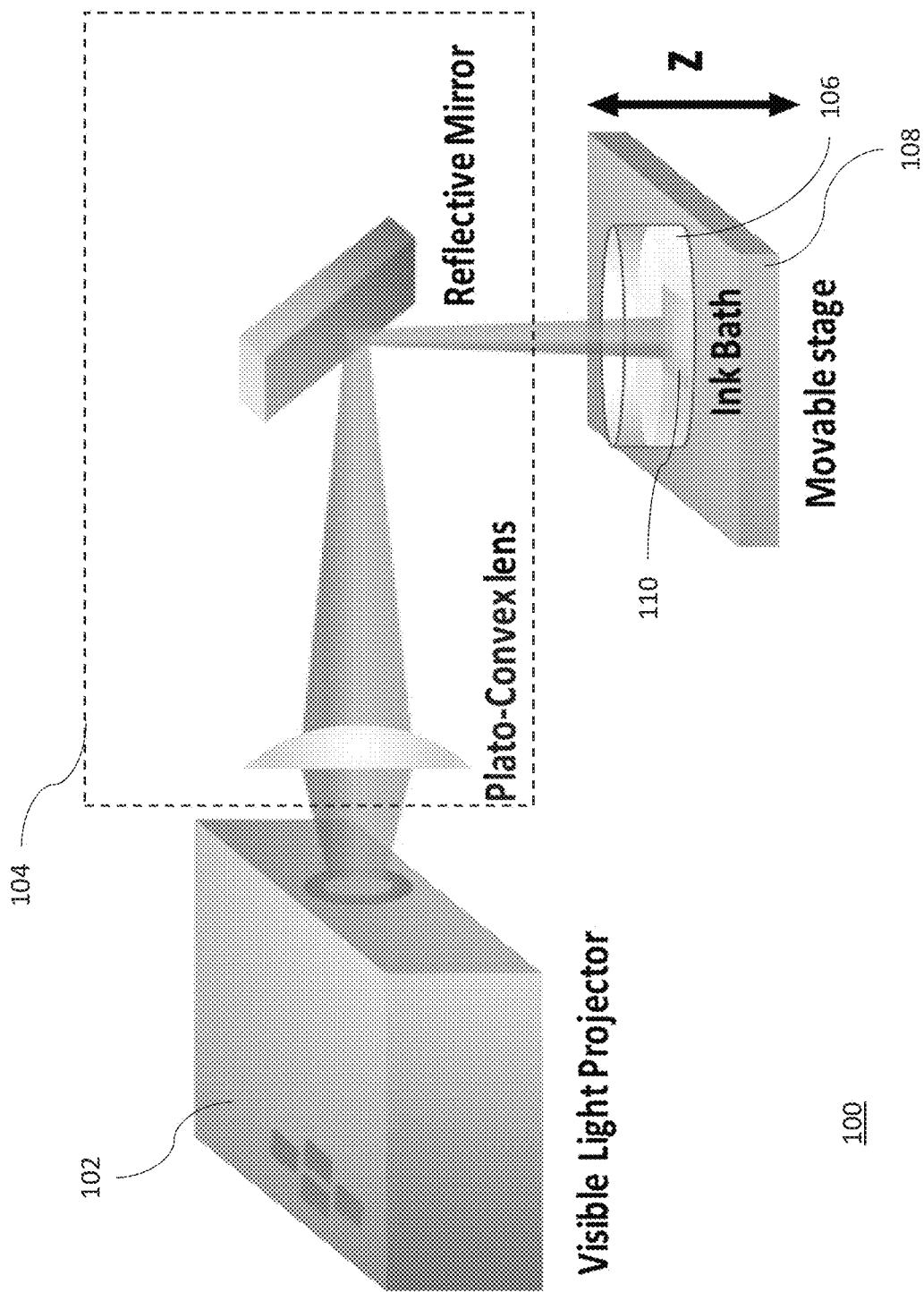
Figure 1B:
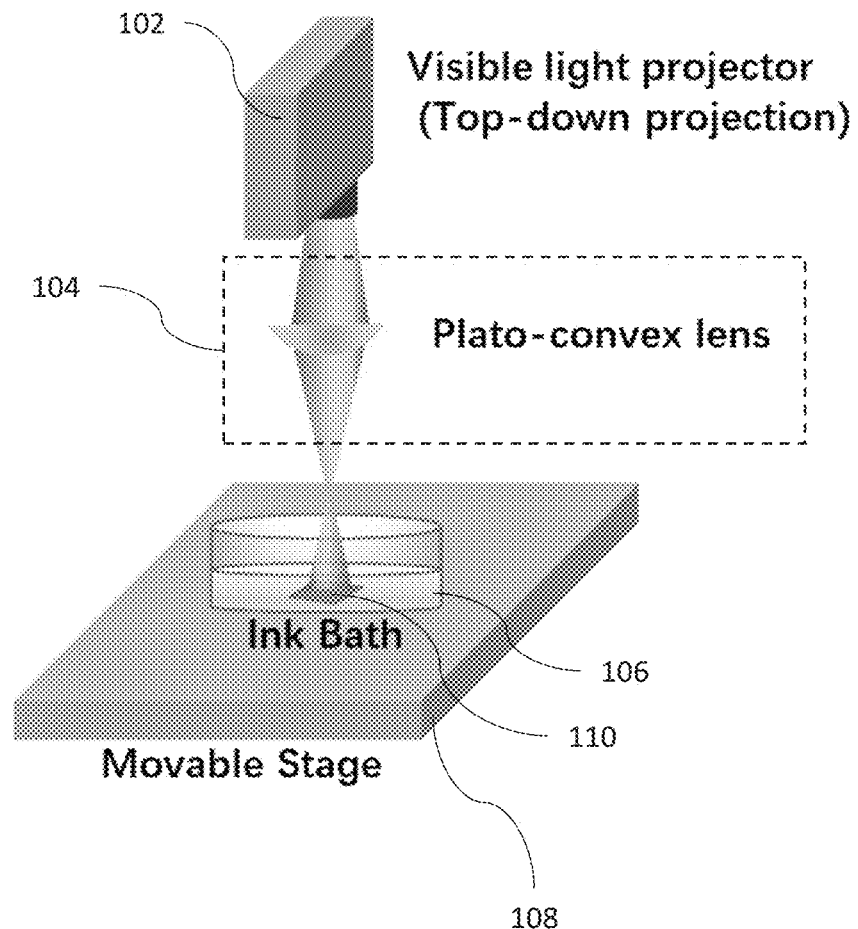

These and other features and advantages of the present apparatus and methods will be better understood by reference to the following detailed description when considered in conjunction with the accompanying data and figures, which are presented as exemplary embodiments of the disclosure and should not be construed as a complete recitation of the scope of the inventive method, wherein:

FIGS. 1A-1B provides a schematic diagram of a metal printing apparatus in accordance with embodiments.

Figure 2A:
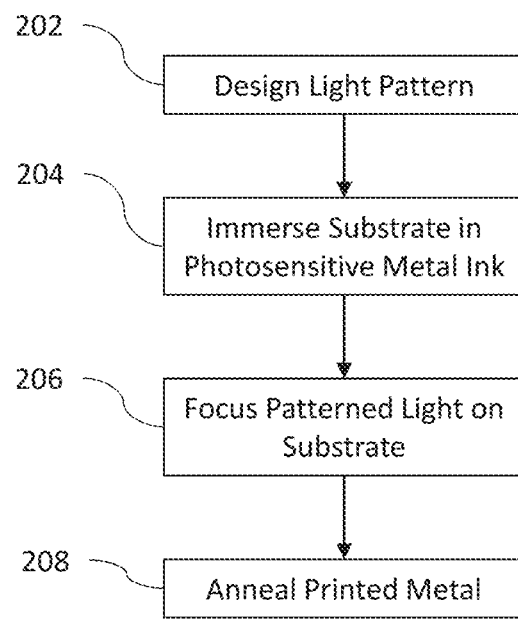

FIG. 2A provides a flow chart of a method for metal printing in accordance with embodiments.

Figure 2B:
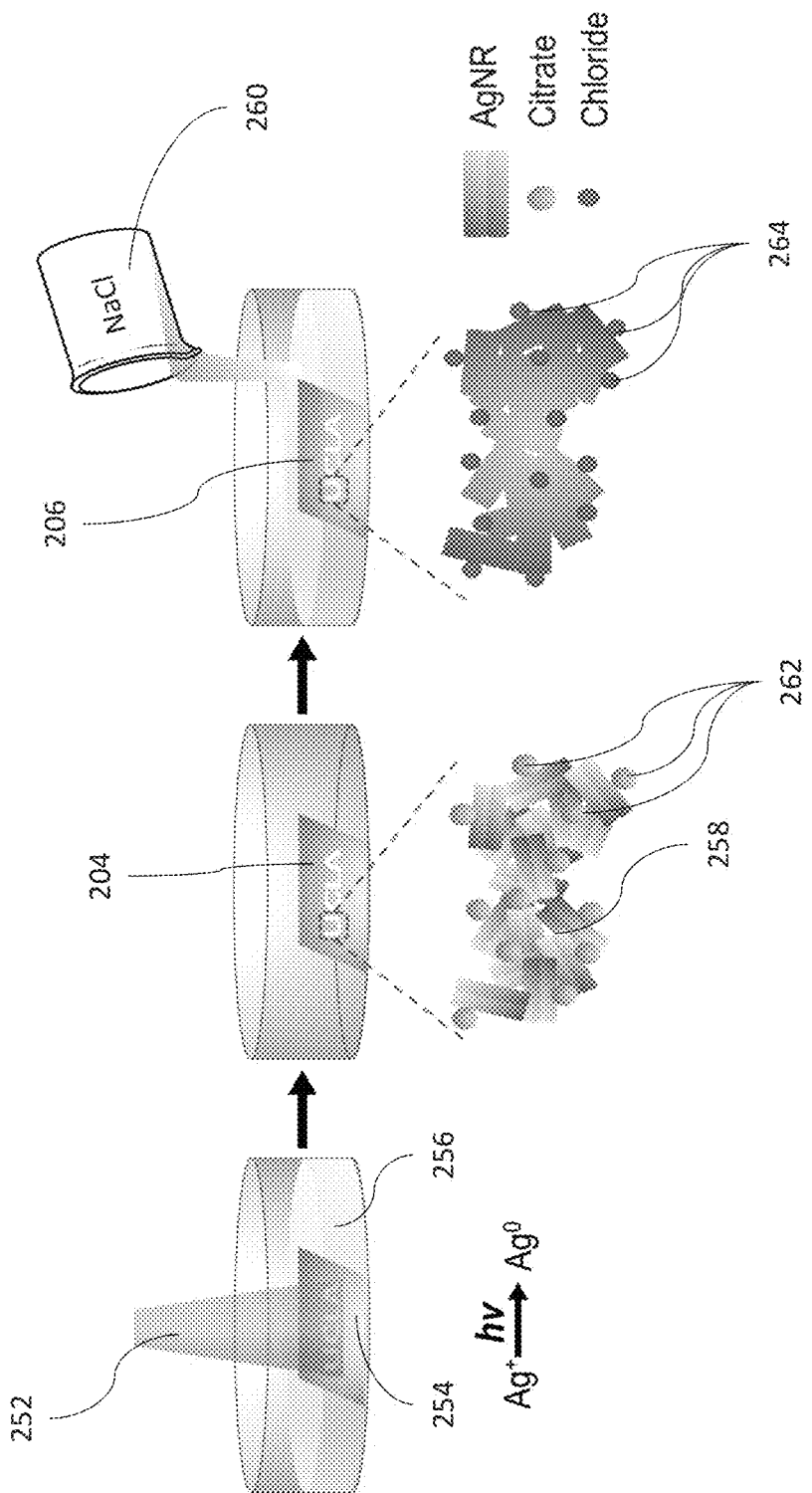

FIG. 2B illustrates chemical processes used in metal printing in accordance with embodiments.

Figure 3:
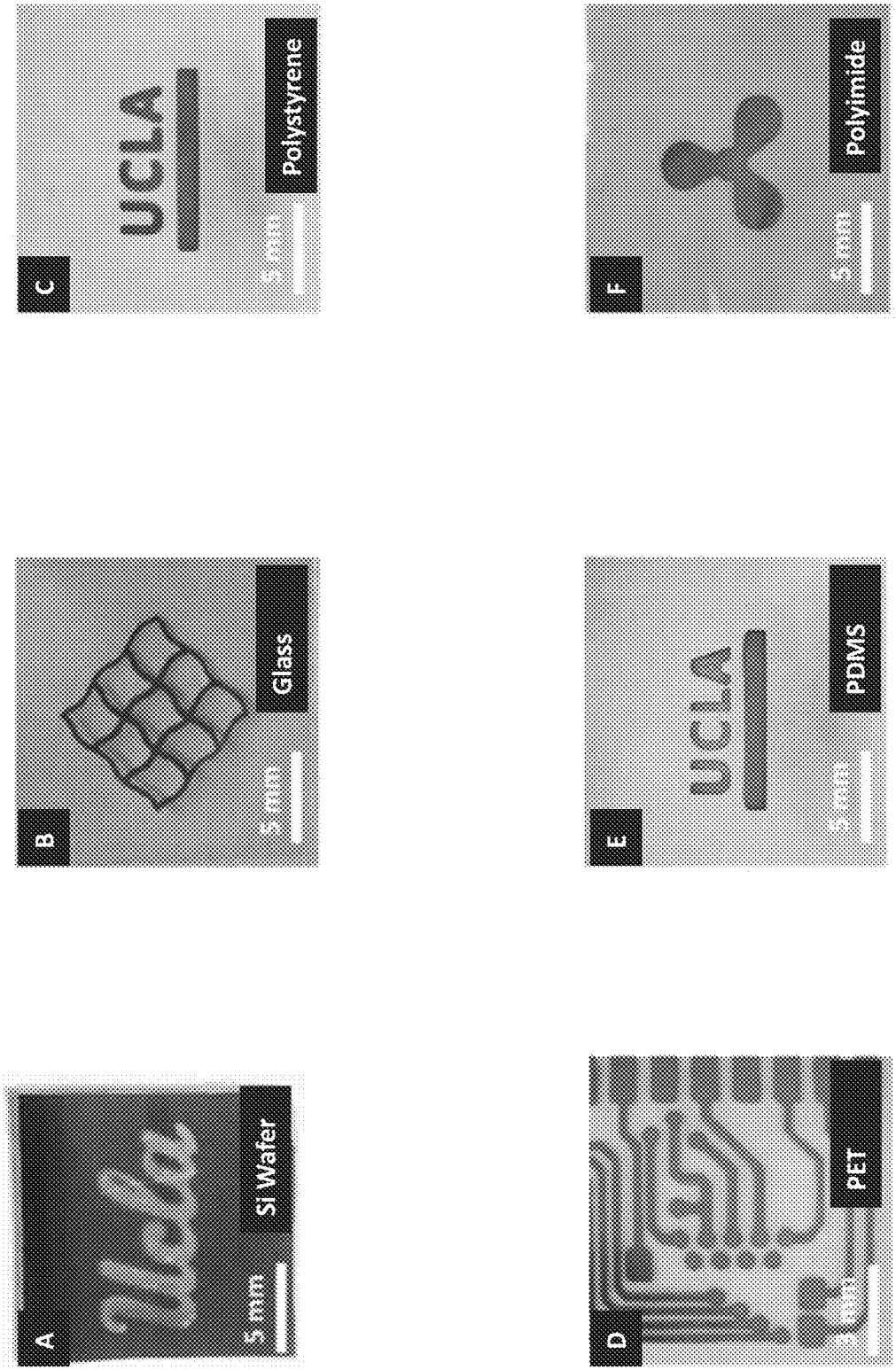
Figure 3:
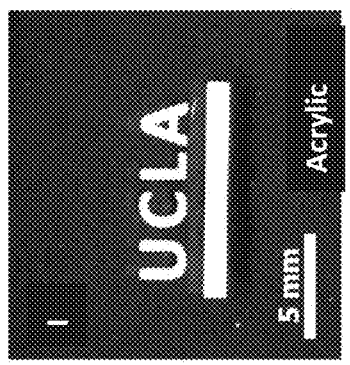
Figure 3:
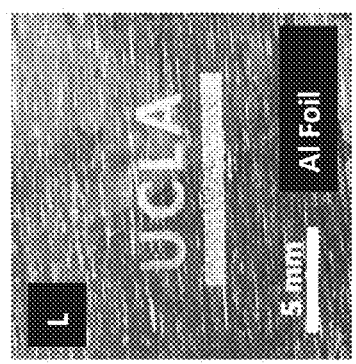
Figure 3:
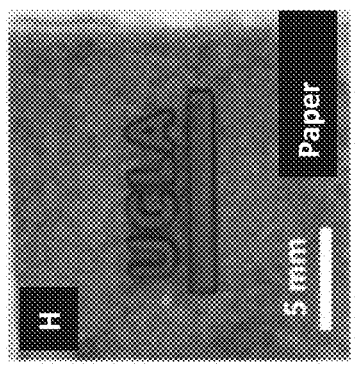
Figure 3:
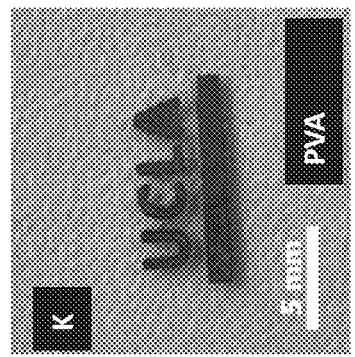
Figure 3:
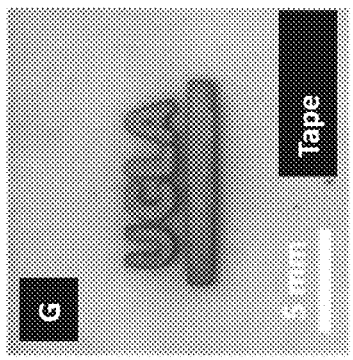
Figure 3:
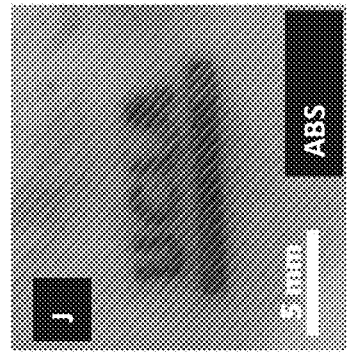
Figure 3:
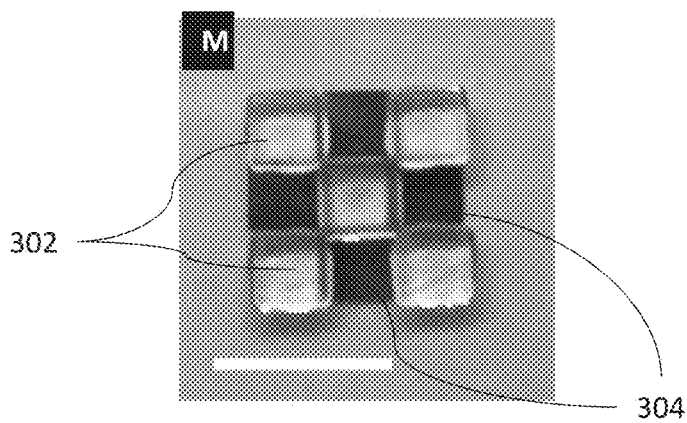
Figure 3:
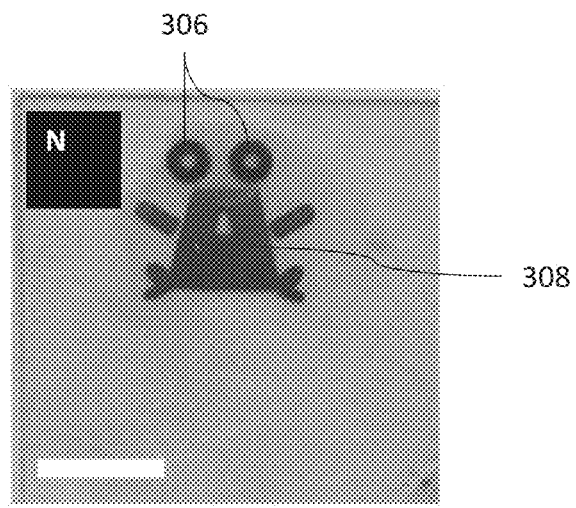
Figure 3:
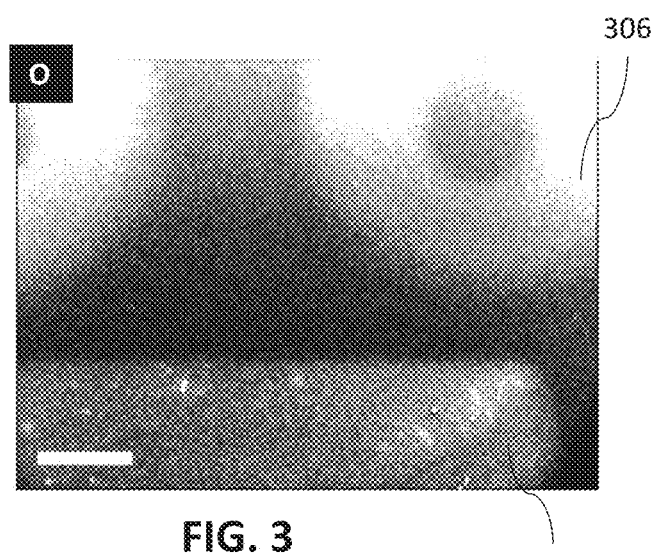
Figure 3:
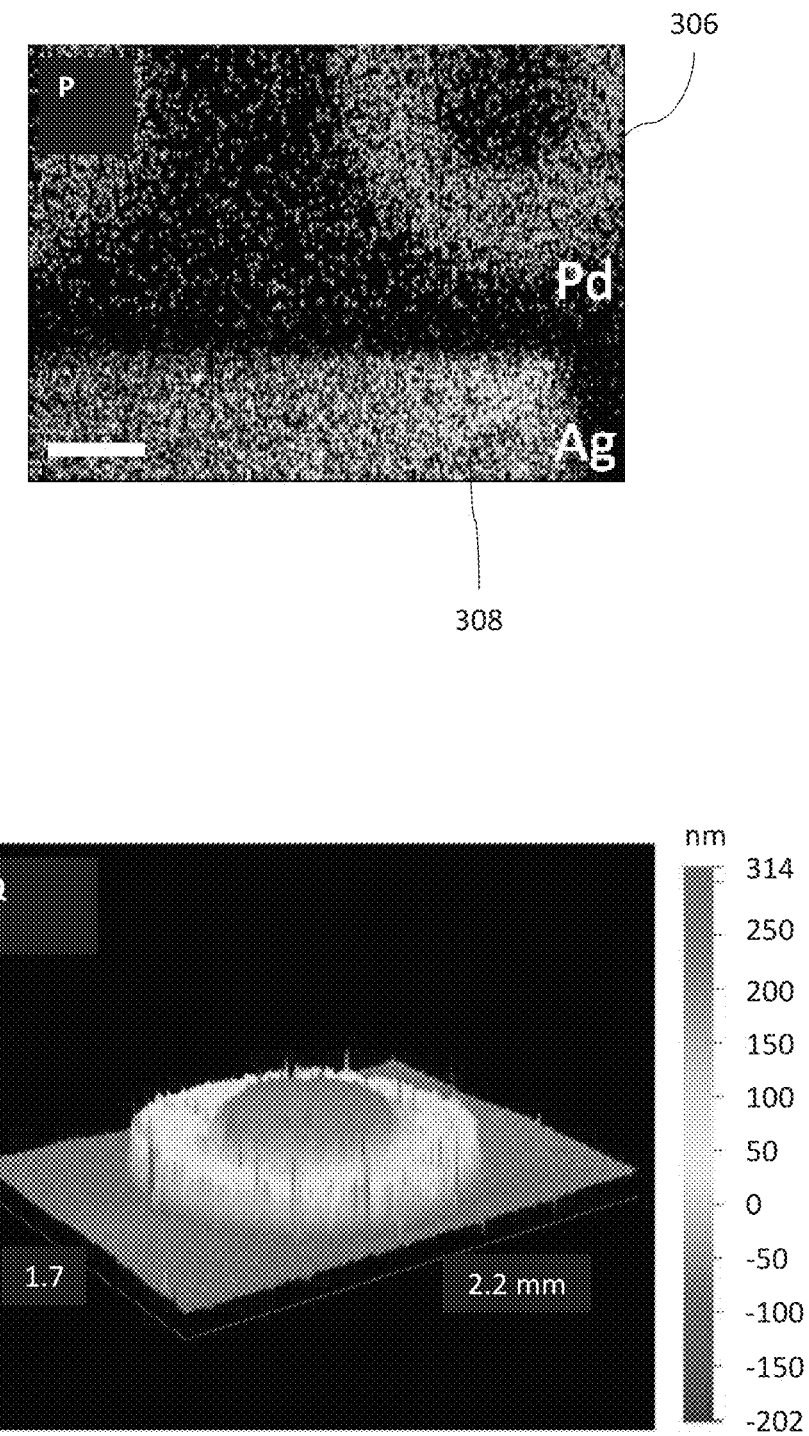

FIGS. 3A-3Q provide photographs of printed metal patterns on various substrates in accordance with embodiments.

FIGS. 4A-4D provide optical microscope images of printed metal patterns on PET substrate in accordance with embodiments.

FIGS. 5A-5F provides scanning electron microscopy (SEM) images of printed metal patterns on PET substrate in accordance with embodiments.

Figure 6:
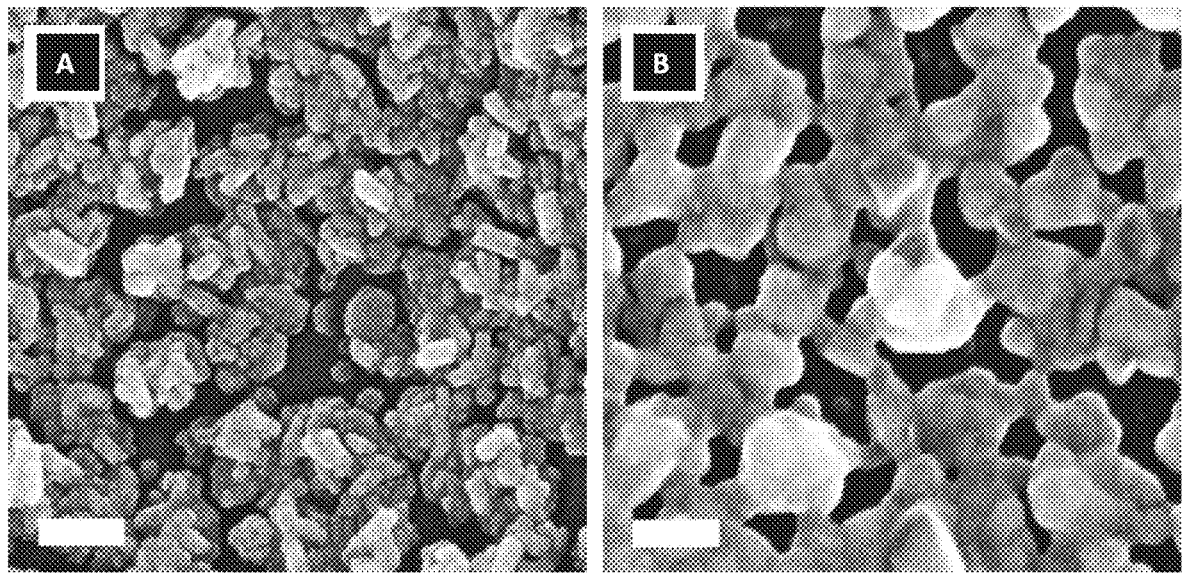

FIGS. 6A and 6B provide scanning electron microscopy (SEM) images of printed metal samples on PET substrate obtained (A) with and (B) without chemical annealing by 20 mM sodium chloride solution (scale bar=200 nm) in accordance with embodiments.

Figure 7A:
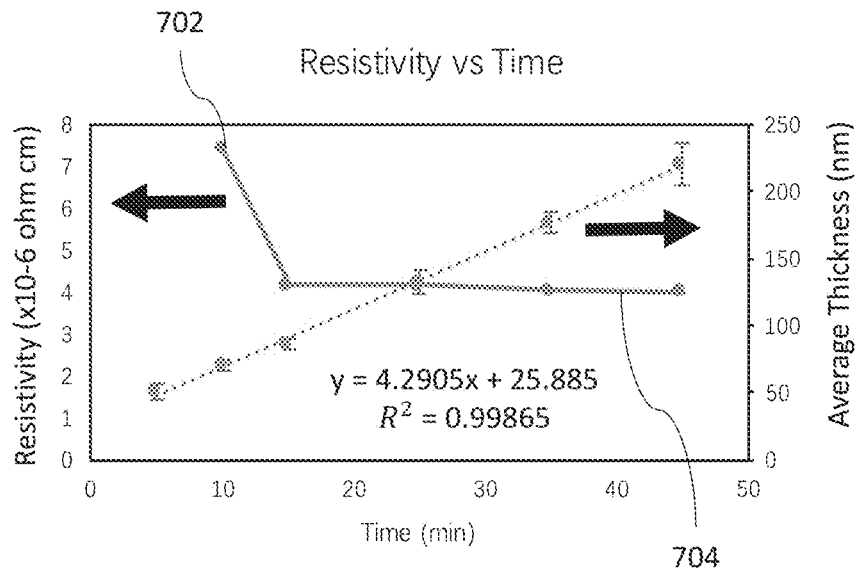

FIG. 7A provides a data plot of resistivity and thickness resistivity of printed metal samples on PET substrate as a function of irradiation time with all other conditions remained the same in accordance with embodiments.

Figure 7B:
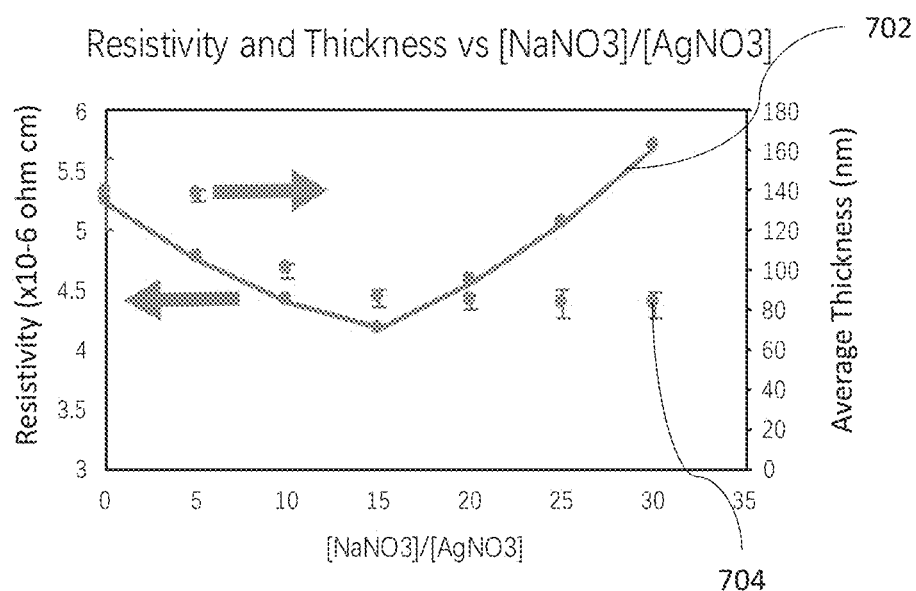

FIG. 7B provides a data plot of resistivity and thickness of printed silver samples on PET substrate as a function of concentration ratio of NaNO3 to AgNO3 with all other conditions remain the same in accordance with embodiments.

Figure 8:
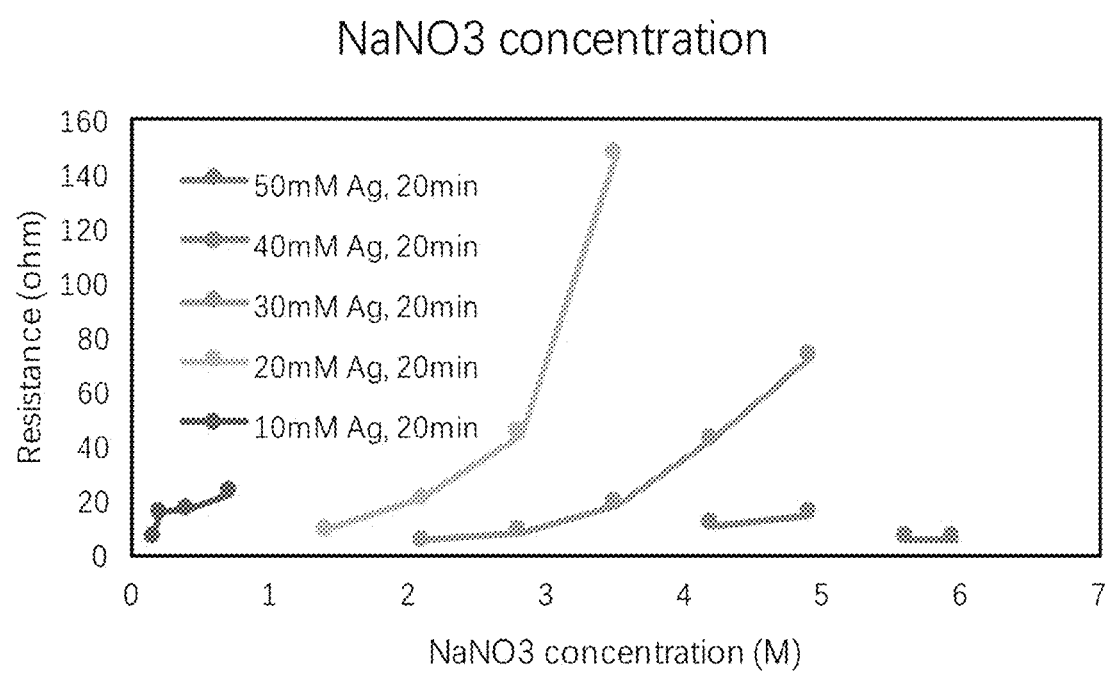

FIG. 8 provides a data plot of the resistance for printed silver patterns for the same irradiation time (20 min) vs. various concentrations of the additive component silver nitrate under different dosage of silver ions in accordance with embodiments.

Figure 9:
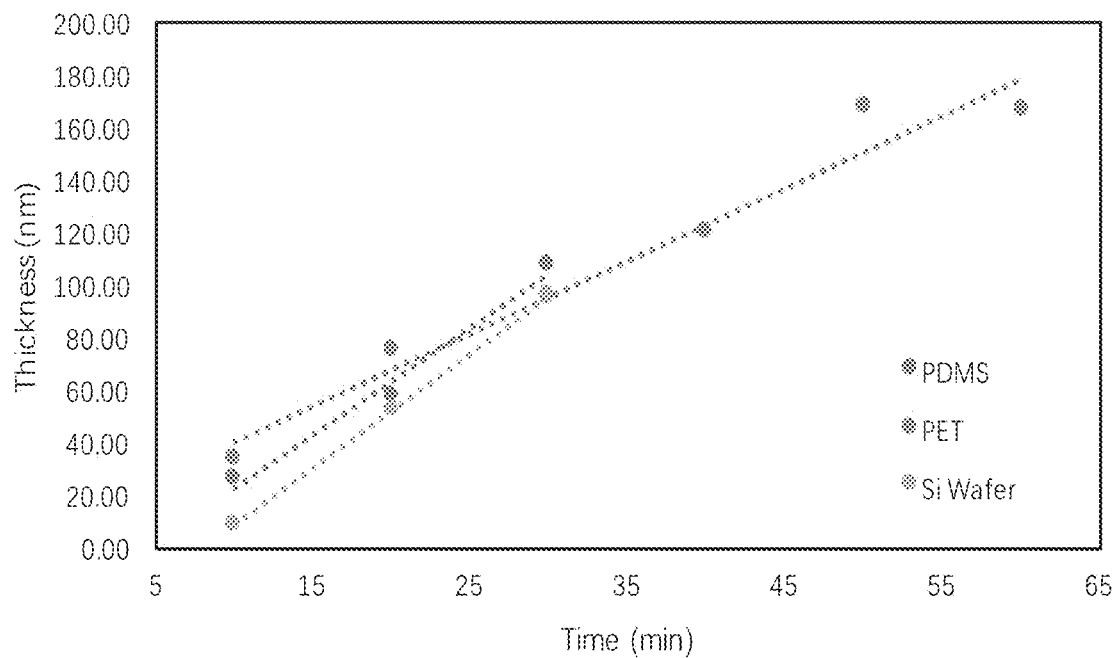

FIG. 9 provides a data plot of the thickness of printed silver as the function of the irradiation time on some of the exemplary substrates in accordance with embodiments.

Figure 10A:
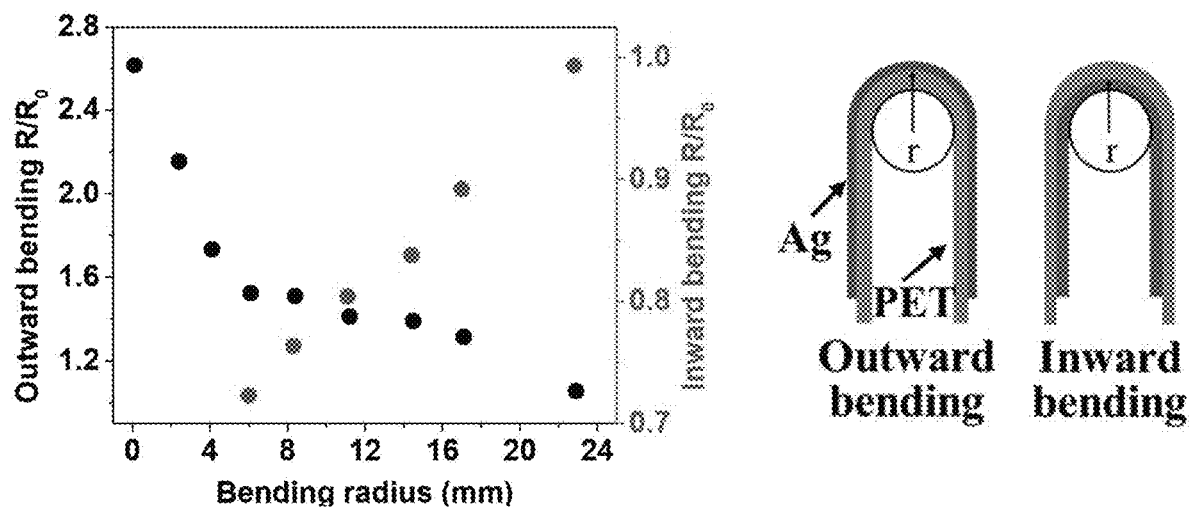

FIG. 10A provides a data plot of the ratio of ending resistance over initial resistance of sliver printed on a PET substrate bent inward and outward as a function of bending radius in accordance with embodiments.

Figure 10B:
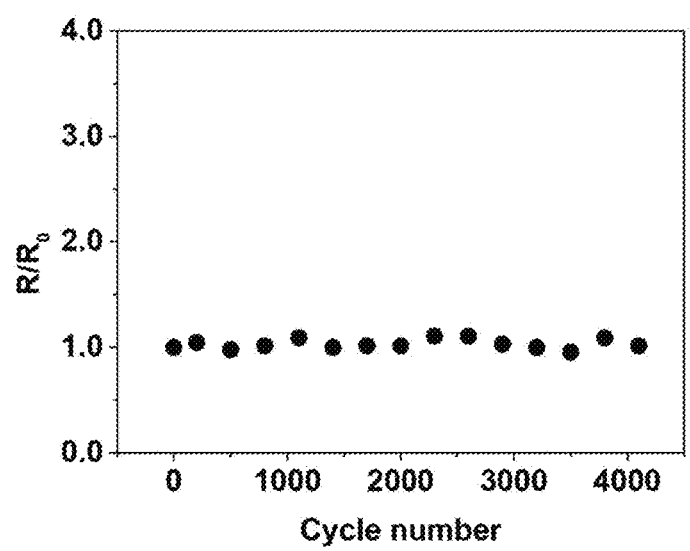

FIG. 10B provides a data plot of the ratio of ending resistance over initial resistance of sliver printed on a PET substrate bent inwardly as a function of number of bends in accordance with embodiments.

Figure 10C:
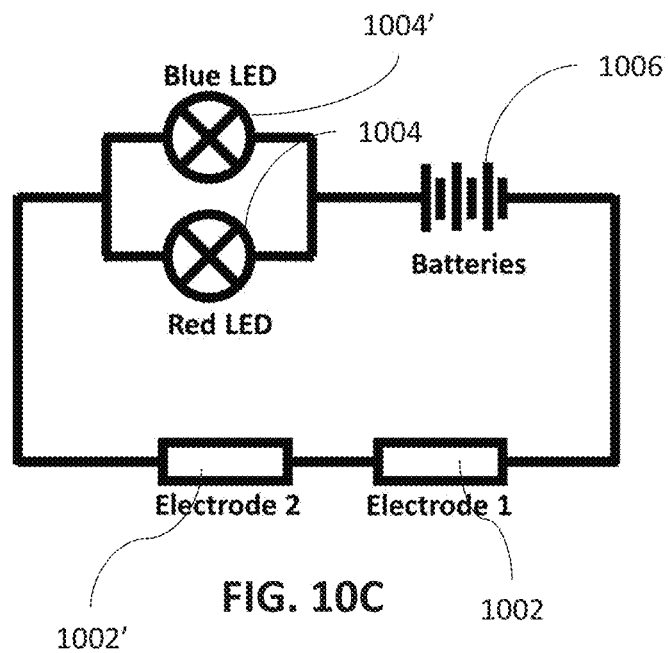

FIG. 10C provides a schematic of a circuit design for a logic gate device fabricated with printed metal electrodes on a flexible substrate in accordance with embodiments.

Figure 10D:
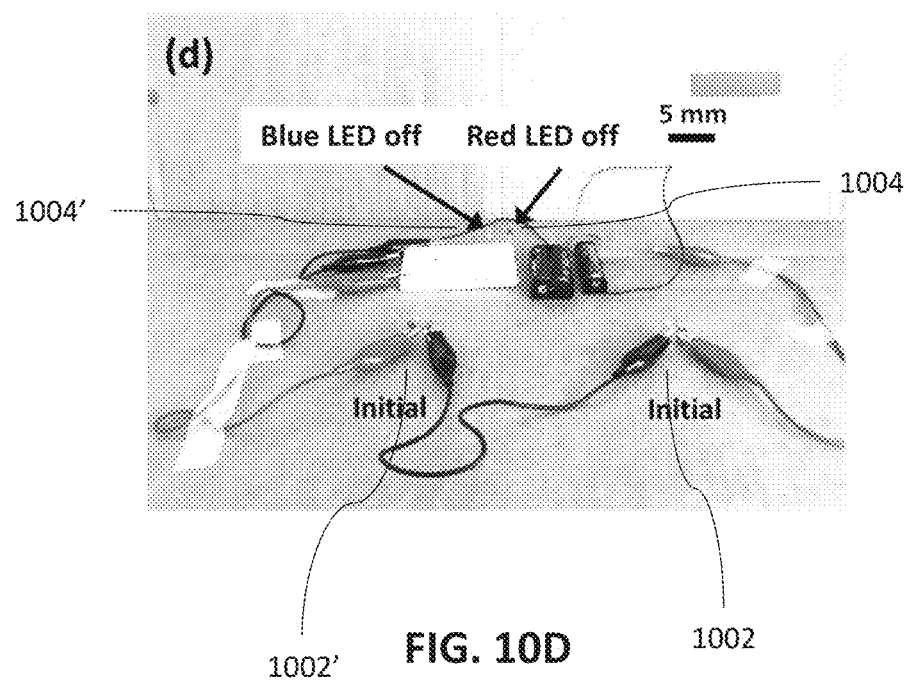
Figure 10E:
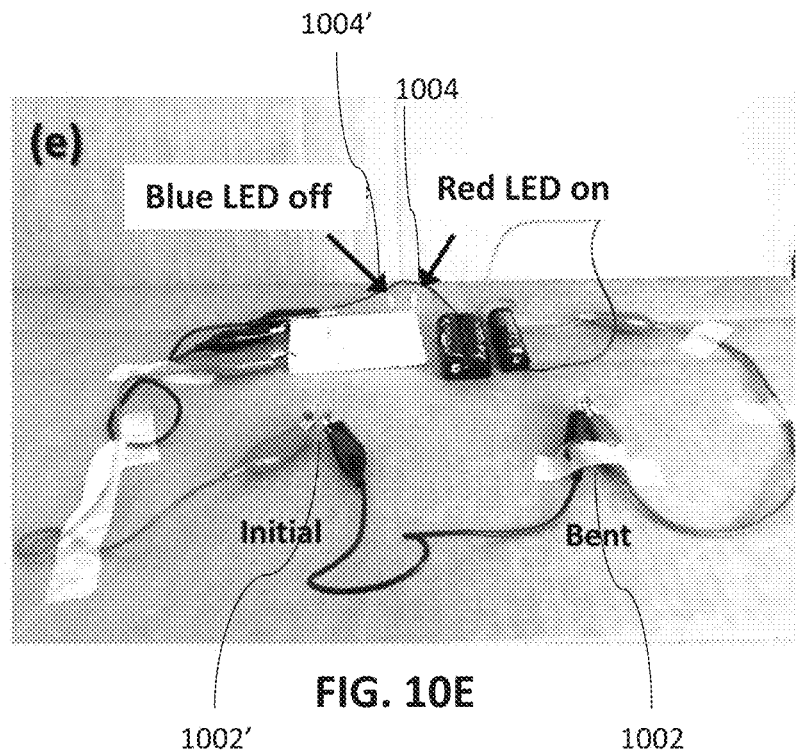
Figure 10F:
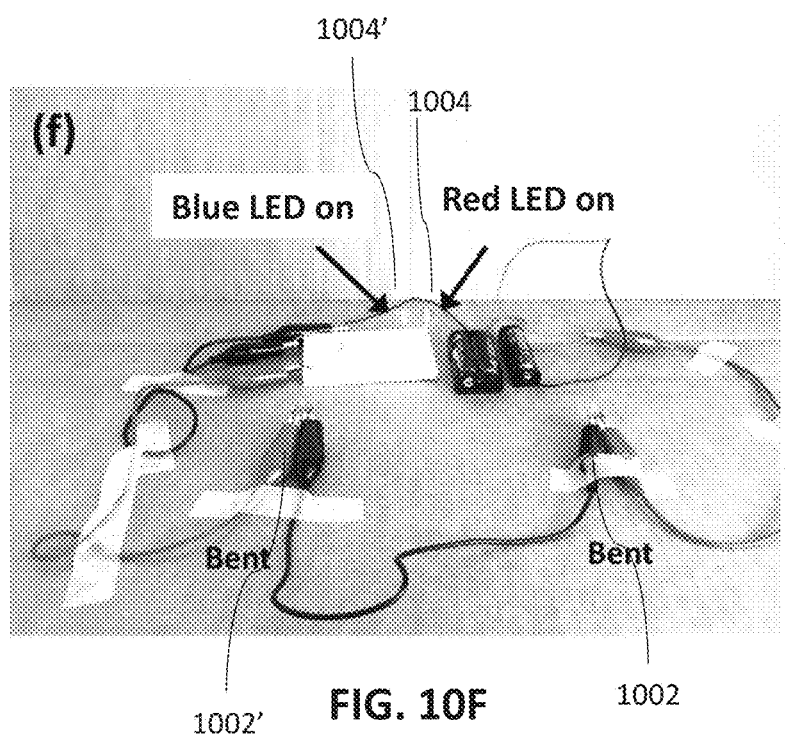

FIGS. 10D-10F provide photographs of a logic gate device fabricated with printed metal electrodes on a flexible substrate in accordance with embodiments.

Figure 11A:
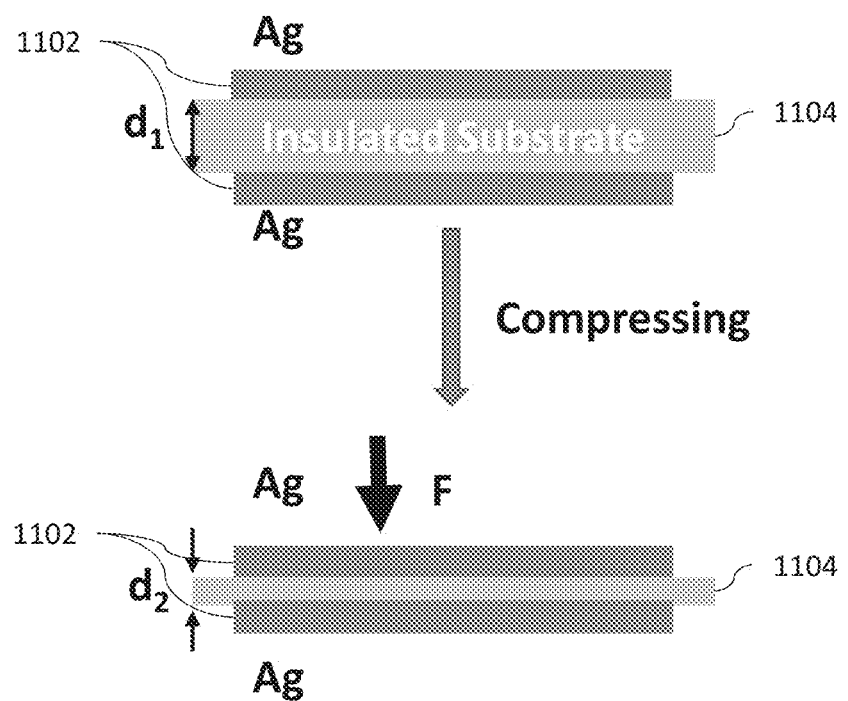
Figure 11B:
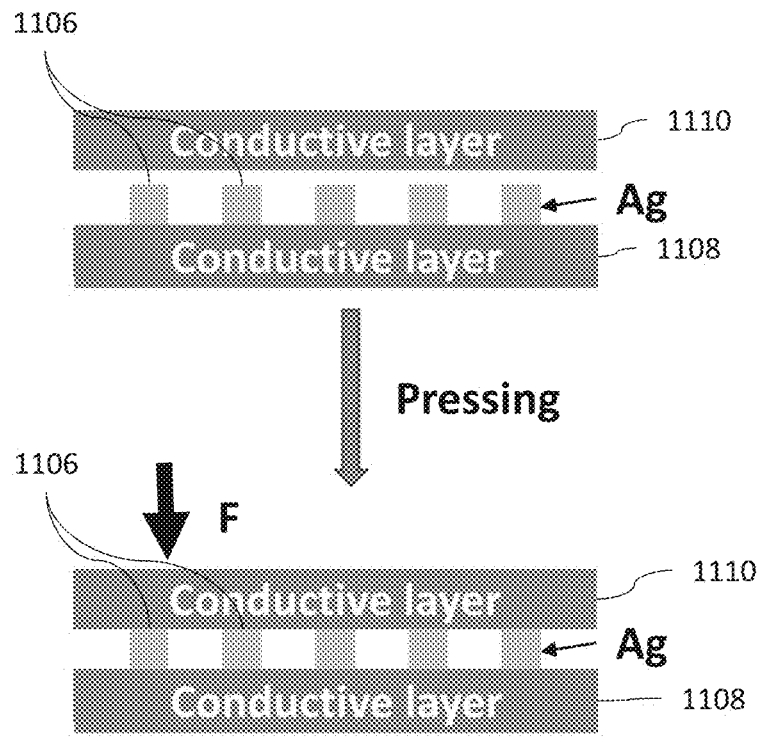

FIGS. 11A-11B illustrate exemplary embodiments of pressure sensors constructed by printing metals on substrates in accordance with embodiments.

Figure 11C:
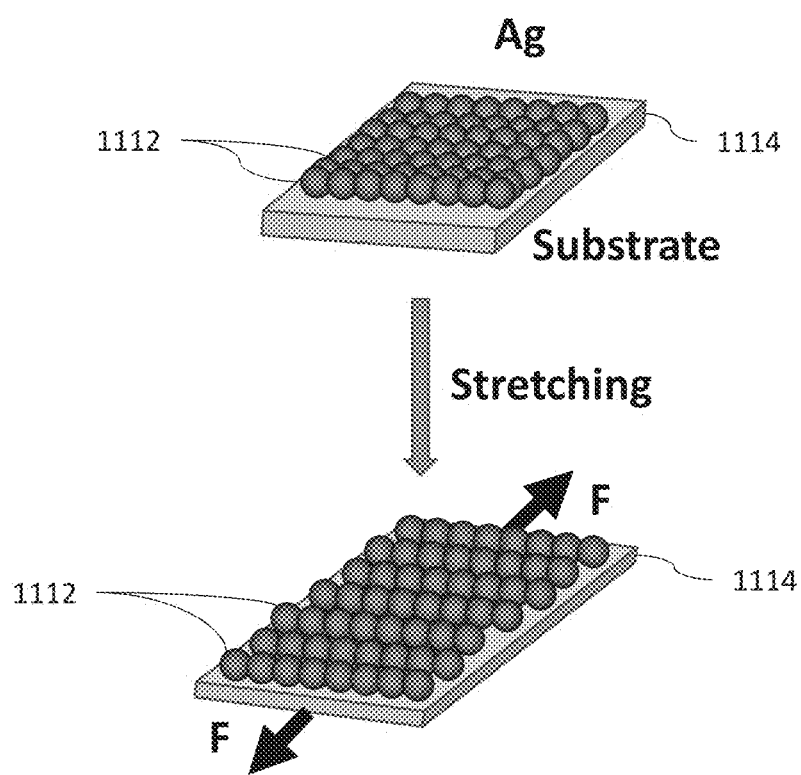

FIG. 11C illustrates a strain sensor constructed by printing metals on substrates in accordance with embodiments.

DETAILED DESCRIPTION OF THE INVENTION

The embodiments of the inventive methods and apparatus described herein are not intended to be exhaustive or to limit the inventive methods and apparatus to precise forms disclosed. Rather, the embodiments selected for description have been chosen to enable one skilled in the art to practice the invention.

Turning now to the drawings, methods and apparatus for fabricating high-resolution thin-layer metal patterns are provided. In many embodiments the methods and apparatus operate via photo-(stereo)lithography at room temperature.

In many embodiments, the printed metal patterns, for example silver patterns, exhibit high electrical conductivity, comparable to or better than the conductivity of the silver printed by current laser sintering or thermal annealing at high temperature. In many embodiments features of the technique include: (1) operating at room temperature, without using conventional laser-sintering or thermal-annealing, which avoids high temperature and damaging the plastics or other low-melting-point components on the substrates; (2) simultaneously producing and depositing metals in one step by using a particle-free metal ions precursor solution as the ink, instead of using conventional metal inks that contain metal nanoparticle seeds as used in current metal printing techniques, nor using metal targets as in conventional metal sputter or evaporator coating; (3) capable of creating 2D patterns and 3D structures on choices of arbitrary substrates as broad as various plastics, silicon, and paper, especially benefiting the metal or conductive layer deposition on substrate materials with low melting points, which cannot be achieved by most current high-temperature sintering-based metal printing methods; and (4) using simple setup based on a commercial project and relatively lower-energy white (visible) light source (compared with commonly used UV light), without complex design and high-cost optical parts. Overall, these features, in accordance with embodiments, make such room-temperature, particle-free metal patterning technique highly desired for fabricating (opto)electronic devices including integrated circuits, transistors, sensors, etc.

Typical state-of-the-art silver patterning technologies have demonstrated a direct silver patterning technology on polyethylene terephthalate (PET) film by a Laser Direct Synthesis and Patterning (LDSP) process. (See, e.g., Lan, C.-J., S.-L. Tsai, and M.-T. Lee, *Micromachines,* 2017. 8(2): p. 52, the disclosure of which is incorporated herein by reference.) A low-power continuous-wave laser simultaneously induced the occurrence of photo-thermo-chemical reduction of silver ions into metallic silver and the formation of silver microstructure in a predetermined pattern. (See, e.g., Robertson, J. and C. Chen, *Applied Physics Letters,* 1999. 74(8): p. 1168-1170, the disclosure of which is incorporated herein by reference.) However, these techniques need at least thirty laser scans to generate a continuous silver line, and the local temperature near the laser focal spot to reach 200° C., which is proven to have melted the PET substrate at the center of silver line. In 2016, Calignano's group reported a technology that produced conductive complex structures with in-situ generation of silver nanoparticles. (See, e.g., Fantino, E., et al., *Advanced Materials,* 2016. 28(19): p. 3712-3717, the disclosure of which is incorporated herein by reference.) These techniques incorporated silver nitrate into a photo-curable oligomer (polyethylene glycol diacrylate (PEGDA)) in the presence of suitable photo-initiators and exposing them to the digital light system to form the composite structures. Yet the resulting conductive structures shown an electrical conductivity of 5-8 orders of magnitude lower than that of bulk silver.

For silver patterning, the electrical conductivity of the printed patterns is the most important criterion for evaluating the patterning technologies, since the silver patterns are often used as the conductors or electrodes in a wide variety of electronics. Yet high processing temperature or high temperature thermal annealing have previously always been necessary for improving electrical conductance of fabricated silver patterns. This high temperature environment limits the application of those technologies for low transition temperature ($T_g$) substrates, which serve as the basic platforms of flexible electronics. Accordingly, embodiments are directed to metal patterning techniques that can achieve high electrical conductivity (>38% of the bulk silver conductivity) under room temperature conditions.

In general, embodiments of the metal printing technique are based on an in-situ generation of metal particles using photo-reaction. In such embodiments, metal is patterned by light patterns displayed on a substrate which is immersed in the precursor solution. Embodiments of the apparatus and process can be divided into four main components, namely an illumination system, a photosensitive ink, substrates, and chemical annealing. An exemplary system design 100 in accordance with embodiments is shown in FIGS. 1A-1B. As shown in FIGS. 1A and 1B, systems of certain embodiments possess three main components: an illumination system 102, such as a projector, pertinent light convergent or divergent and collimating parts 104, such as a plato-convex lens and/or one or more reflective mirrors, and a stage 106 where a photo-(stereo)lithography reaction takes place in an ink bath 108. In many embodiments, the stage 104 is moveable. In some embodiments, illumination system 102, will comprise a light source, and light patterning structures. In various embodiments the light source will span the entire wavelength range of visible light, while some embodiments will utilize will utilize a limited range of the wavelength range of visible light. Embodiments of the light source could be monochromatic (such as a laser) or polychromatic (such as white light). The light patterning structures, according to embodiments, providing patterned light for the design can be a projector (including a commercial projector), a digital micromirror device (DMD), or liquid-crystal display (LCD), or any other component capable of patterning light in a desired configuration.

Pertinent light convergent, divergent and collimating parts 104 utilized in accordance with embodiments may be based on the choice of light source and light patterning structures for the purpose of light path alignment and focusing. During operation of some embodiments, the light pattern generated by illumination system 102 is converged by a convex lens, aligned by a reflective mirror, and focused on a substrate 110. While the specific example illustrated in FIG. 1A uses a convex lens and reflective mirror and the specific example illustrated in FIG. 1B uses a convex lens, these are not meant to be limiting on the invention, as additional configurations or components can be used in accordance with embodiments, as convergent, divergent and collimating parts are known in the art and can be configured in many ways to accomplish the purpose of focusing light from an illumination source 102 to a substrate 110.

The substrate 110 in many embodiments is immersed in an ink bath 108 containing a metal ink solution bath and the metal ion reduction process begins as soon as the ink solution is illuminated. The substrate 108 in an ink bath 108 of various embodiments is placed on a stage 106, which can be moved up and down to enable layer-by-layer constructing into 3D structures. In many embodiments, the metal in the ink solution is silver, while additional embodiments will be palladium, platinum, gold, copper, ruthenium, and/or any other metal that is desired for a desired purpose.

Turning to the photosensitive particle-free metal ink, in many embodiments the ink is composed of metal source and a solvent. Additional embodiments of the photosensitive particle-free metal ink will optionally comprise additive components. In various embodiments, the metal source is one or more organic and/or inorganic metal salt that can be decomposed to form metal element under the exposure to light. For instance, in silver printing, silver citrate, silver acetate, and modified Tollens' reagent. One example of the chemical reaction equations is shown below.

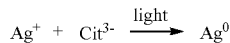

$$Ag^+ + Cit^{3-} \xrightarrow{light} Ag^0$$

However, additional embodiments will use compatible compounds to print other metals onto a substrate.

In various embodiments containing additive components, the additive components are provided to assist in the formation and deposition of the metal. In some embodiments, the choice of additive components is dependent on the metal chosen. For example, in silver printing:
  i) inorganic salts, such as sodium citrate, sodium nitrate, potassium acetate, etc., promote the dissolving of the silver source and facilitate the deposition of formed metallic silver particles at desired regions;
  ii) silver nanoseeds provide the sites for silver ion reduction reaction to take place, which accelerate the cores generation process through heterogeneous nucleation.

Finally, the solvent of various embodiments is selected based on solubility of the chosen metal salt (e.g., a selected silver salt) and the optional additive components. In many embodiments, the solvent ensures the dissolution of all components to desired concentrations.

In embodiments, a broad variety of substrates can be chosen depending on various applications, including both rigid and flexible substrates. For example, polyethylene terephthalate (PET) is a transparent, flexible and thermoplastic polymer resin used in fibers for clothing, containers for liquids and foods, among many other uses. PET exhibits high affinity for metallic silver and is successfully patternable with conductive silver structures using embodiments. In many embodiments, PET is directly patterned with conductive silver structures without any pretreatment to the substrate. In several embodiments, substrates with a lower affinity for specific metals will be pretreated to facilitate metal deposition to the substrate; otherwise, the deposited metal may result in unsatisfactory performance in electrical conductivity. Substrate pretreatment aims to modify chemical structure of the surface of substrates so as to attract formed metallic silver particles to precipitate on substrates. As an example, aminopropyltriethoxysilane (APTES) is used in some embodiments to modify the surface of the selected substrate. APTES is an aminosilane ended with an amino functional group commonly used in the process of silanization, the functionalization of surfaces with alkoxysilane molecules. APTES creates a $NH_2$-self-assembled monolayer ($NH_2$-SAM) on the substrate to enhance adhesion of solid-solid interface with molecule scale adhesion. (See, e.g., Zhao, Z., et al., *ACS Applied Materials & Interfaces*, 2013. 5(13): p. 6097-6107, the disclosure of which is incorporated herein by reference.) Silicon wafer is one example of a substrate that requires surface modification in accordance with some embodiments. Silicon wafer is a thin slice of semiconductor material used in electronics for the fabrication of integrated circuits and in photovoltaics for conventional, wafer-based solar cells. The wafer often serves as the substrate for microelectronic devices that are built in and over the wafer. Due to poor adhesion between silicon wafer and metallic silver particles, surface modification of the wafer allows for successfully carrying out metal (e.g., silver) deposition process.

Additional embodiments will forego pretreatment by introducing small concentrations of adhesion promotors such as vinyl polymer (VP), polyvinylpyrrolidone (PVP), and/or polyvinyl alcohol (PVA), which improve adhesion of some previously poorly adhering substrates. After introducing one or more of the adhesion promotors in accordance with various embodiments, printed metal patterns will firmly adhere to the substrates and will not be peeled off by washing with water or ethanol.

In other embodiments, chemical annealing is introduced to improve the properties of as-printed metals. The selection of reagents for chemical annealing depends on the specific metal and the specific properties that are needed to improve. For silver printing, chemical annealing is extremely significant to obtain the electrical conductivity comparable to bulk silver for the printed silver. Although many suitable chemical annealing materials may be used in embodiments, strong electrolyte salts, such as calcium chloride, calcium nitrate, sodium chloride, and sodium nitrate, are the effective candidate agents for chemical annealing. Upon addition of strong electrolyte salts, remaining citrate groups adhered to the surface of printed silver patterns are removed through strong competitiveness of these strong electrolyte salts, which brings the photo-reduced silver particles into contact with each other to form larger particles and hence significantly improves the electrical conductivity. (See, e.g., Grouchko, M., et al., *ACS Nano*, 2011. 5(4): p. 3354-3359, the disclosure of which is incorporated herein by reference.) For example, upon addition of calcium chloride to anneal printed silver, citrate ions remaining on the printed silver surface are removed. A color change from dark to bright metallic silver are apparent when calcium chloride is added for annealing printed silver.

Embodiments of methods 200 to print metals are shown schematically in FIGS. 2A-2B. As shown in FIG. 2A, one or more light patterns are designed in many embodiments at step 202. The light pattern is designed using any suitable platform, including commercial software, such as a desktop publishing or design program (e.g., Microsoft PowerPoint, Adobe Photoshop, etc.). In several embodiments, 3D structures will be generated in the metal printing or photo-(stereo)lithography process, thus multiple patterns will be designed representing subsequent layers of the printed structure. Alternatively, a 3D design can be created, which will gradually change in sequence with movement of the stage at subsequent steps, thus allowing a continuous printing of the metal design on the substrate.

At step 204 of various embodiments, the substrate is immersed in an ink bath containing a photosensitive metal ink. The ink bath of many embodiments, is placed on a stage where the photo-(stereo) lithography reaction takes place.

At step 206 of various embodiments, patterned light is focused onto the substrate. The patterned light is generated using an illumination source (e.g., through a digital light processing (DLP) apparatus or a projector under computer control (e.g., FIG. 1, 102)). The patterned light undergoes collimation and/or alignment through optical parts (e.g., FIG. 1, 104) and finally focuses on a substrate in certain embodiments. As the substrate is immersed into a metal ink bath and the liquid layer thickness above the substrate is controlled at a specified length-scale (such as, for example, around 2-3 mm). As light continuously shines on the substrate immersed in metal ink solution, energy from the light induces the reduction of metal ions to metals, which simultaneously deposits onto the illuminated region of the substrate. As a result, the metal patterns are generated on selected area of substrate. An illustration of step 208 is shown in FIG. 2B, where pattern light 252 is illuminated on substrate 254 in an ink bath 256, which results in deposition of metal 258 onto the substrate in the shape of the patterned light.

In some embodiments, the stage is moved to allow deposition of subsequent layers of the desired pattern at step 208. Moving the stage allows for the 3D structures to be printed.

In certain embodiments, after the illumination step 204 and optionally the stage moving step 206, the substrate with printed metal patterns is immersed into calcium chloride solution for chemical annealing at step 208. An apparent color change from dark to bright can be easily observed on the printed patterns to indicate that annealing has been performed. The annealing step 208 is illustrated in FIG. 2B, where a chloride solution 260 is added to the substrate, which allows for the citrate ions 262 to be replaced with chloride ions 264.

It should be noted that in many embodiments, the steps stated above can be performed in a different order than the order described. Additionally, certain embodiments will perform the steps simultaneously, such as in 3D printing as described above. Further, some steps may be performed more than once. For example, in some embodiments, a single layer will be deposited prior to the design and illumination of a subsequent layer.

Embodiments of the above method allow for the printing of metal patterns on a variety of substrates. Some exemplary patterns printed on various substrates are shown in FIGS. 3A to 3L, including silicon wafer (FIG. 3A), glass (FIG. 3B), polystyrene (FIG. 3C), PET (FIG. 3D), polydimethylsiloxane (PDMS) (FIG. 3E), polyimide (FIG. 3F), tape, (FIG. 3G), paper (FIG. 3H), acrylic (FIG. 3I), Acrylonitrile butadiene styrene (ABS) (FIG. 3J), polyvinyl alcohol (PVA) (FIG. 3K), and aluminum foil (FIG. 3L). In FIGS. 3A-3C and 3E-3L, the scale bar represents 5 mm, while the scale bar in FIG. 3D is 3 mm. Additionally, FIGS. 3M-3P illustrate the ability of various embodiments to print hybrid structures, where FIG. 3M shows poly(1,6-hexanediol diacrylate) 302 and silver 304 printed in a checkerboard pattern. Additionally, FIG. 3N illustrates a frog printed with palladium eyes 306 and a silver body 308. Additionally, FIG. 3O shows a scanning electron micrograph of the frog form FIG. 3N, and FIG. 3P shows an energy-dispersive X-ray spectroscopy (EDS) image of the frog form FIG. 3N. The scale bars of FIGS. 3M and 3N are 500 mm and 500 µm in FIGS. 3O-3P. Further, FIG. 3Q shows a 3D surface topography of a two-layer structure printed on a silicon wafer measured by an optical profiler. As shown in FIGS. 3A-3Q, these images demonstrate the capability of embodiments of the metal patterning technique to print arbitrary 2D patterns on a variety substrates as well as the ability to print 3D structures, to print hybrid structures making of metals and polymers, and to print multi-metals such as silver and palladium.

Characteristics of Printed Metals

Various embodiments of printed metals will possess high resolution and conductivity with relatively fast fabrication times that result in metallic structures that are stable and stretchable.

Resolution

The ability to project a clear image of a small feature is limited by the wavelength of the light and the aperture of the lens system. Basically, the minimum feature size that a projection system can print can be approximately given by:

$$CD = k_1 \cdot \frac{\lambda}{NA}$$

Where:
CD—the minimum feature size;
$k_1$—a coefficient, typically equals to 0.4 for production;
$\lambda$—wavelength of light, visible light: 390-700 nm;
NA—the numerical aperture of lens.

Currently, various embodiments are capable of approximately 15 µm resolution, which can be obtained using a 1080P projector and 60 mm focal distance convex lens. By modifying the lens and updating projector resolution (e.g., from 1080P to 4K) certain embodiments will theoretically possess a resolution as high as to 200 nm.

Figure 4:
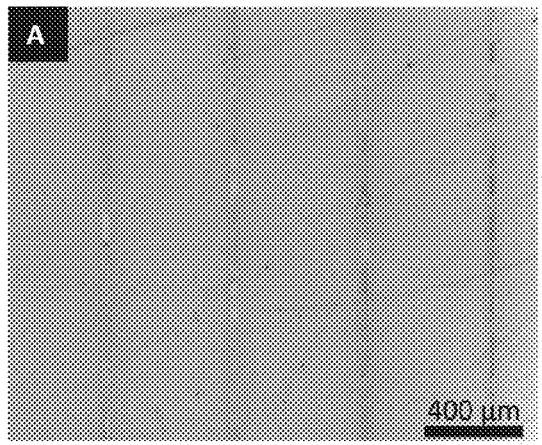
Figure 4:
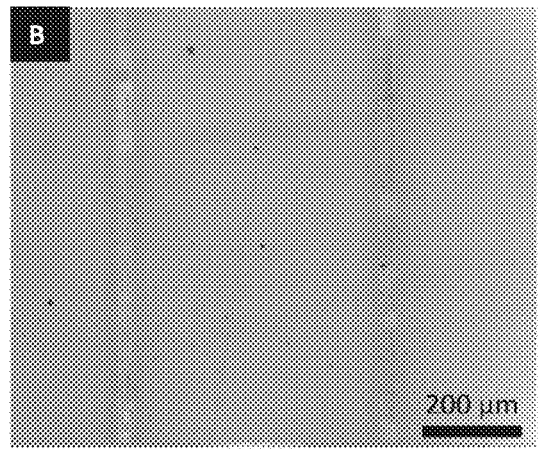
Figure 4:
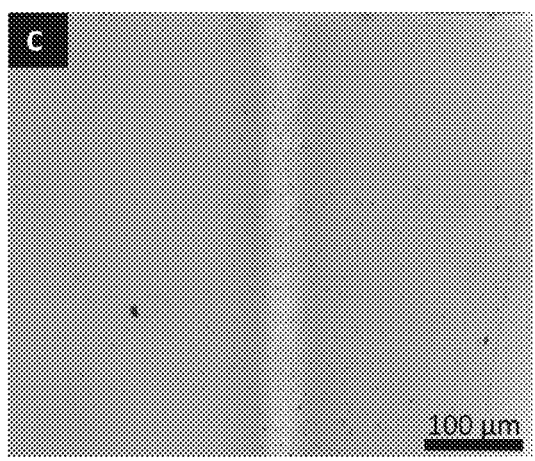
Figure 4:
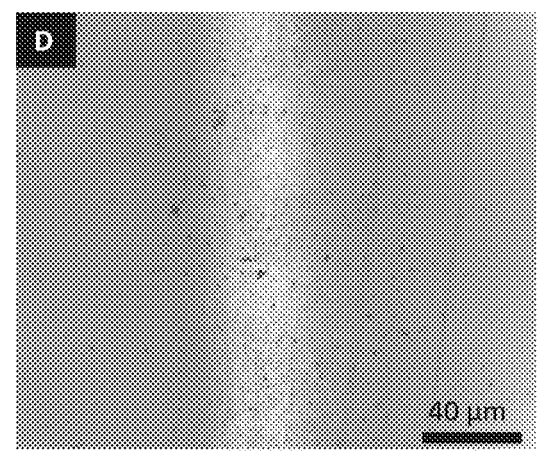
Figure 5:
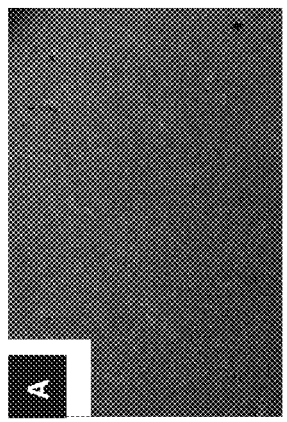
Figure 5:
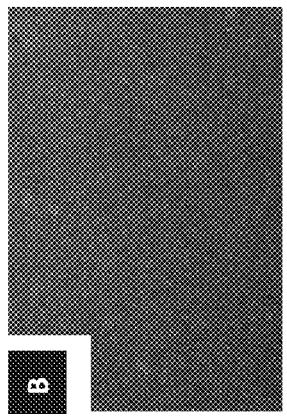
Figure 5:
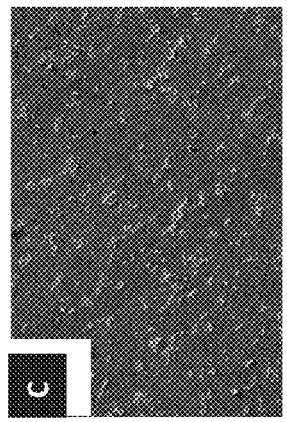
Figure 5:
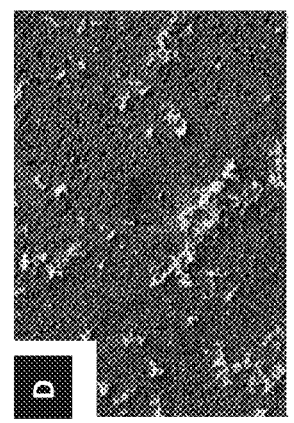
Figure 5:
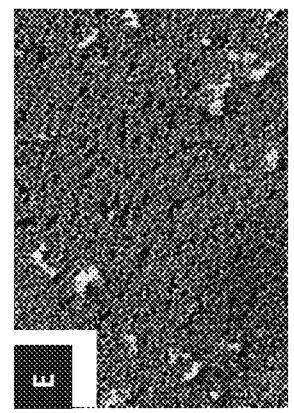
Figure 5:
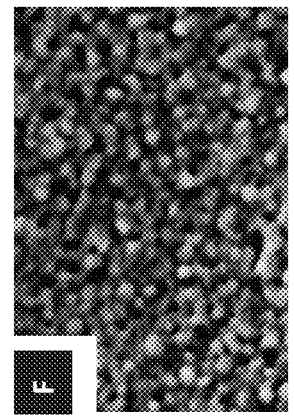

Resolution of certain embodiments is demonstrated with optical microscope images in FIG. 4. (In these examples, the sample was chemically annealed with 20 mM sodium chloride.) The microstructures of the printed patterns are investigated by scanning electron microscopy (SEM) are presented in FIG. 5 and FIGS. 6A-6B. In FIG. 5, a homogeneous layer of silver nanoparticles with the size around 200-300 nm shows good connection between particles, which explains the excellent electrical conductivity of printed silver patterns from the aspect of microstructures. (In these examples, all the samples were chemically annealed with 20 mM sodium chloride for ~3 seconds following the printing process.) FIGS. 6A and 6B show the morphology change induced by chemical annealing. Upon the addition of chemical annealing reagents, silver particles in nano-scale rod-shape (with the length around 200-300 nm and width around 80-120 nm) merge into larger, micron-scale particles of irregular shape (with average diameter of 200-300 nm), indicating effectively promoted connecting of particles. (The aspect ratio is around 1.5:1 to 2.5:1. After chemical annealing, coalescence occurs and necking forms between particles.)

Printing Speed

The performance of printed silver patterns (i.e. electrical conductivity) and the printing rate (speed) can be further fine-tuned in accordance with embodiments by:
1) silver ink compositions, including the type of silver salts, concentration and concentration ratio of each component, also different types of additive reagents, etc.;
2) printing parameters, including intensity of light, irradiation time, wavelength of incident light (depending on which kind of silver source is exploited), etc.

In many embodiments, the light intensity (power per unit irradiation area) is tuned by changing the brightness of light source, changing the color or grayscale of digital images, and/or using convex lens with different focal lengths. For example, by replacing the convex lens of certain focal length (3 f) with another one with half of its focal length (f), the irradiation intensity is increased by 9 times and as a result, the time required to obtain silver patterns with measurable electrical conductivity is reduced from 15 minutes to 3 minutes. Similarly, the optimum irradiation (reaction) time, required to further obtain better electrical performance of printed silver patterns, reduced from 20 minutes to only 5 minutes. This demonstrates that our printing technique is highly tunable and controllable to meet the different requirements of various applications.

Additionally, the existence of α-hydrogen in printing systems in accordance with various embodiments, which can promote the generation of free radicals which can accelerate the reduction process of silver ions in the precursor solution. As such, by introducing a small amount of ethanol or 2-proponal into the system will enhance the fabrication speed. With the addition of ethanol or 2-proponal in certain embodiments, the fabrication time will be shortened to achieve similar electrical properties.

Conductivity

The electrical performance of the silver patterns as the function of irradiation time and the concentrations of each component are shown in FIGS. 7A-7B and 8, respectively. The conductivity is the reciprocal of resistivity. Resistivity is the resistance of unit cross-section area. Higher conductivity (or lower resistivity) value, which indicates the better electrical conductance of the printed metal patterns, is favorable. More particularly, as shown in FIGS. 7A and 7B, the resistivity of printed silver samples on PET substrate as a function of irradiation time with all other conditions remained the same. In these embodiments, as shown in FIG. 7A, a silver ink comprised of 10 mM $AgNO_3$, 15 mM $Na_3Cit$ and 150 mM $NaNO_3$. Upon 10 minutes of irradiation, the resistivity (or conductivity) 702 became measurable, which means the printed silver patterns are good enough to conduct electricity as the thickness 704 increased. However, to obtain a better electricity conducting performance, irradiation time of 15 minutes is required. The resistivity does not change significantly after irradiation time of 15 minutes. As shown in FIG. 7B, the resistivity 702 of printed silver samples on PET substrate as a function of concentration ratio of $NaNO_3$ to $AgNO_3$ with all other conditions remain the same. The silver ink comprised 10 mM AgNO3, 15 mM Na3Cit and various concentration of $NaNO_3$. The irradiation time for each sample is 15 min. The best resistivity result is obtained when the $NaNO_3$ concentration reaches 150 mM for the silver ink with 10 mM $AgNO_3$. Meanwhile, FIG. 8 shows that under the same conditions of other components, the optimal concentration of sodium nitrate would be the lowest possible concentration of sodium nitrate that allows the dissolving of all the components. When the sodium nitrate concentration is too low, some white precipitates will form and result in a bad electrical performance for the printed silver patterns. The thickness of printed silver patterns as the function of irradiation time is shown in FIG. 9, which shows that longer irradiation time results in the formation of more silver nanoparticles.

Performance on Substrates

It is noteworthy that, the whole technique of metal patterning described above in accordance with embodiments proceeds under room temperature, which shows excellent compatibility with materials of low glass transition temperature (Tg) or melting point (Tm), especially polymer or other plastic substrates, required by fabricating flexible (opto) electronics and other devices. This is a great superiority compared with prevailing technologies, most of which require thermal annealing treatment above 200° C. or cause substantial local temperature increase up to 300° C. during patterning process, such as laser sintering. (See, e.g., Hyun, W. J., et al., *ACS Applied Materials & Interfaces*, 2015. 7(23): p. 12619-12624; and Lan, C.-J., S.-L. Tsai, and M.-T. Lee, *Micromachines*, 2017. 8(2): p. 52, the disclosure of which are incorporated herein by reference.) Overall, the photo-induced metal patterning technique exhibits excellent electrical conductivity for printed silver under the mild processing condition, such as low reaction temperature (as low as room temperature), using low-cost materials with unique simultaneous process of in-situ metal generation and pattern formation. The whole design, according to embodiments, is uncomplicated, high efficient, easy to control, and inexpensive.

Exemplary embodiments demonstrate successful metal patterning, such as silver, palladium and platinum, on various substrates under room temperature utilizing white light as patterning optical source. As previously discussed, the current state of the art relies on three main approaches to achieve metal patterning each having disadvantages. Embodiments of the metal patterning technique is a physical mask-free, room temperature method utilizing aqueous based solution as the ink, which avoids all the drawbacks of metal patterning technique mentioned above. Taking silver patterning as an example, upon irradiation of 15 min under the brightness of 3200 lumen and following by chemical annealing with sodium chloride, conductive silver patterns with electrical conductivity of $2.4 \times 10^7$ S/m, 38% of bulk silver could be obtained, which is sufficient for effective electrical conductance. Electrical performance of printed silver patterns can be further improved by optimizing silver ink composition, annealing method, optical parameters, etc. Light irradiation time can also be shortened with optimization of conditions listed above.

Flexibility

Turning to FIG. 10A-10E, metals printed in accordance with some embodiments will function when the substrate is bent and the conductivity changes with the bending curvature. For certain electronics operation, the stretchability of the patterns will be vital for performance and operation. Many embodiments of metal printed components will be tailored to realize high stretchability and stable conductivity upon 10-20% stretch, which can be useful for stretchable or flexible electronics. Specifically, FIG. 10A illustrates resistance tunability of printed flexible metal electrodes on a PET substrate in accordance with some embodiments. In FIG. 10A, shows increased resistivity of printed metal on a flexible substrate as the radius decreases in outwardly bent embodiments (e.g., the patterned metal is located on the exterior surface of the flexible substrate). Additionally, FIG. 10A, shows decreased resistivity of printed metal on a flexible substrate as the radius decreases in inwardly bent embodiments (e.g., the patterned metal is located on the interior surface of the flexible substrate). FIG. 10B illustrates the stability and resiliency of certain embodiments, as the resistivity remains relatively stable over many cycles of bending or flexing of embodiments of a printed metal on a flexible substrate. For example, some embodiments will be able to withstand at least 100, 500, 1000, 1500, 2000, 3000, 4000, and/or 5000 cycles of bending while maintaining a constant resistivity.

Thus, harnessing the combination of excellent resistance tunability and fatigue resistance, printed metal patterns of various embodiments can be readily used in strain sensors, flexible circuits, wearable electronics, and biomedical devices. Turning to FIGS. 10C-10F, a simple logic gate device integrating the printed metal electrodes on a flexible substrate with light-emitting diodes (LEDs) and control the on and off of the LEDs by tuning conductivity of the Ag electrodes via bending. Specifically, FIG. 10C shows a circuit design 1000 of a simple logic gate device, where two LEDs 1004, 1004' (represented by a circle with cross inside) are connected in parallel, while the two printed metal electrodes 1002, 1002' (represented by rectangles) are connected in series along with a power source 1006, such as batteries. As resistance is reduced, such as by bending at least one of the printed metal electrodes 1002 and/or 1002', one or both LEDs 1004 and 1004' will illuminate. In FIG.

10D, both printed metal electrodes 1002, 1002' are in in an initial, unbent state, where the resistivity is increased, and both LEDs 1004, 1004' remain off or unilluminated. By introducing a bend in one electrode 1002, as illustrated in FIG. 10E, resistance decreases, and a single LED turns on 1002 or illuminates. In FIG. 10F, both electrodes 1002, 1002' are in a bent state, which decreases resistance even further and causes both LEDs 1004, 1004' to illuminate.

Stability

Metals printed in accordance with certain embodiments will be tailored and optimized to withstand harsh environments such as high humidity, high temperature, dramatic temperature fluctuations, and mechanical stress and abrasion by adapting the methods described above.

Summary

Based on the above characteristics, various embodiments of the metal printing technique exhibit three main features superior to those competing technologies:

(1) Electrical conductivity of our printed silver patterns reaches $2.4 \times 10^7$ S/m (38% of bulk silver conductivity), which is much higher than the conductivity of the recently reported photo-induced silver printing products with the conductivity of $10^4 \sim 10^6$ S/m (on the scale of 0.01-1% of bulk silver conductivity), for example $4.4 \times 10^6$ S/m (7% of bulk silver conductivity). This is mainly attributed to the compact packing of formed metallic silver particles and the chemical annealing process that leads to the removal of residual citrate ions and better connection of metallic silver particles.

(2) In-situ generation of silver particles allows fabrication of complex and conductive metal patterns with precise control. Resolution of printed patterns is determined by the resolution of DLP system and light source, which allow the resolution of printed metal features to be tuned according to practical applications.

(3) The whole 2D pattern in one layer is fabricated simultaneously as a whole under one light exposure, while most of other technologies print patterns serially (droplet-by-droplet or line-by-line to form a whole pattern). Also, using projection stereolithographic system, which essentially can automatically stack the printed patterns layer by layer, can produce 3D structure of metal. Overall, the process time for printing either 2D patterns or 3D structures is greatly reduced especially for complex and large patterns. For example, in ink-jet printing or selective laser sintering (SLS) methods, patterns are created by computer-controlled movement of the ink-jet nozzle or the laser, so relatively much longer time is required for printing patterns that are complicated or of large size.

(4) The whole fabrication process of metal patterns, including the printing process and subsequent chemical annealing process, is carried out under room temperature, which allows the printing substrates to be flexible ones with low glass transition temperature (Tg) of melting point (Tm). This opens up a novel next-generation manufacturing technique for fabricating soft/flexible/wearable (opto)electronics or soft robotics. In contrast, currently used selective laser melting (SLM) technology uses a high energy laser beam to melt metal particles completely to form dense structures. The temporal temperature at the laser irradiated locations reaches higher than 1000° C., which has been shown damages the low-Tg substrates, such as PET (Tg=70° C.).

Therefore, embodiments of the metal printing technique largely extend the choice of printing substrates, and the mild processing conditions allow embodiments to be used for broader applications as described below.

Uses of Printed Metals

Sensors

As discussed above, embodiments of the disclosed metal printing technology can be applied to various substrates to meet different sorts of application requirements, such as pressure sensors and/or strain sensors as illustrated in FIGS. 11A-11C. Turning to FIG. 11A, pressure sensors in accordance with some embodiments are achieved by printing silver patterns 1102 on both sides of a slab of soft substrate 1104. Silver patterns on both sides work as two electrodes and the whole design works as capacitor. When external force is applied to the device, the soft substrate deforms and consequently changes its thickness, which results in capacitance variation. Thus the pressure change is monitored by capacitance change of this device.

Turning to FIG. 11B, another type of pressure sensor in accordance with various embodiments is achieved by printing a base layer of silver patterns 1106 on a first conductive substrate 1108 and putting a second overhanging conductive layer 1110 parallel to and spaceabley placed apart from the first substrate 1108, forming a normally open circuit. When the device is relaxed, the first 1108 and second 1110 substrates are separate, and no electric current is passed through the circuit. If pressure is applied to device, the first 1108 and second 1110 substrates will be connected via the silver patterns 1106 at the pressed spot and electrical signals can be detected. Both types of pressure sensors illustrated in FIGS. 11A and 11B will be applied as touch sensor in display in accordance with various embodiments.

Turning to FIG. 11C, strain sensors in accordance with certain embodiments are achieved by patterning silver 1112 on flexible substrates 1114. In these embodiments, silver particles 1112 are deposited on the substrate 1114. As the device is stretched or compressed, deformation of the substrate 1114 also causes the change of particle packing level in the printed silver layer. The inter-particle distance change results in electrical conductivity change. When the deformed substrate 1114 relaxes, it recovers its original stage and the electrical conductivity also returns to its original value. Thus the strain can be monitored in real-time by this devices in accordance with certain embodiments.

Currently, to fabricate such pressure and strain sensors in accordance with these embodiments, the most difficult part is to create conductive patterns with high accuracy and short fabrication time.

Microelectronics

With electronic devices becoming ever smaller, 3D integration of microelectronics is highly desirable but still challenging to achieve with current micro/nanofabrication techniques. Specifically, this requires creating electrically conductive connectors between different micro-units, and packaging electronic devices requires creating metal wires, connectors, or even complex 2D or 3D structures of 1-10 μm feature size on plastic units with low melting points of 70-300° C. As portable and/or smart devices emerge, flexible or wearable electronics for real-time health-/environment-monitoring or for integrating with other devices employing more and more flexible plastics materials as substrates or key components are required. This, in turn, leads to the need for techniques that can deposit metal at mild condition, specifically at low temperature (not exceeding the melting points of the plastics subject to damage under laser or thermal annealing, as the necessary step in current printing methods) and without harsh chemical or nanomaterial residual (such as silver particles in current silver inks). Soft robots are also being developed that will revolutionize 20th century's robotic systems that are made of rigid materials. To craft soft robots, soft electronic devices will play an indispensable role in transforming a stiff control system into a flexible one. Soft electronic devices can be fabricated by printing electronic circuit onto a flexible substrate. The circuit can be designed using computer software and projected to the flexible substrate from commercial projector. Upon light irradiation for around 15 minutes, silver particles are deposited onto the substrate and formed the conductive pattern of a designed circuit. Thus a soft electronic device can be achieved.

The main challenge for fabrication of soft electronic devices is the low glass transition temperature (Tg) of flexible substrate materials, which will deform or decompose under high temperature and cannot function normally. However, current electronic devices fabrication technologies typically require a high processing temperature or post treatment under high temperatures up to 200° C. or even 1000° C., which exceeds the highest temperature those flexible substrates can bear and causes damage to the substrates. Even worse, high temperature is essential to improving the electrical conductivity during the patterning and/or post-annealing processes in conventional fabrication technologies.

Embodiments of the disclosed metal printing technique avoid high temperatures, as well as the high-energy-input and high-cost processes involving laser or heating for example. Both the printing process and post-treatment (i.e. chemical annealing) are conducted at room temperature. The resulted printing products exhibit excellent electrical performance comparative to bulk silver, which is superior to other reported technologies. Fabrication of soft electronic devices under room temperature also avoids any damage to flexible substrates triggered by high temperature. Meanwhile, embodiments are universal to various substrates, which extends its application in broader different fields.

Additionally, 3D structures fabrication is typically achieved by stacking a series of 2D patterns. Printing methods in accordance with various embodiments allow for effective stacking of multi-layers of printed metal. Once the fabrication speed is enhanced and effective stacking mechanism is established, embodiments can create 3D micro structures, which can be applied in manufacturing Micro-Electro-Mechanical Systems (MEMS).

Printed Circuit Boards

Various embodiments allow for fabrication of different scales (meter to micrometer) of conductive patterns on various substrates in a single step, which is very useful for simplifying and reducing cost of printed circuit board (PCB) fabrication. Additionally, certain embodiments are also suitable for pre-production simulation of designed circuits, which require relatively lower current density but focus more on the versatility of modifying designed circuits.

Chip Encapsulation

In silicon die encapsulation, a trend called "all copper" has been taking place in industry, which is using copper for all interconnects and solder points on silicon die. Certain embodiments will be used to print copper on silicon, which has great potential in providing new solution for silicon die encapsulation.

Electromigration

Electromigration is the transport of material caused by the gradual movement of the atoms in a conductor due to the momentum transfer between conducting electrons and diffusing metal atoms. This effect is noticeable in applications where high direct current is passed through, such as in microelectronics and related structures. As the structure size in electronics decreases, the practical significance of this effect increases. Electromigration needs to be controlled at a moderate level to ensure stability of the micro/nano circuits. Silver is most susceptible to migration among common metals. Some embodiments described herein provide a simple and inexpensive technology to fabricate silver circuit patterns can serve as a great platform for studying electromigration in designed circuits.

Electromagnetic Shielding

Metal grids are usually used as electromagnetic shielding materials. Various embodiments can fabricate silver thin lines, forming silver grids on different substrates, which will be useful for anti-electromagnetic interference (EMI), also called as radio-frequency interference (RFI), by printing silver mesh on flexible substrates to protect certain devices from electromagnetic interference.

Summary

In summary, embodiments provide a new strategy for metal patterning under room temperature utilizing light signals to control patterning with following advantages over existing methods:

The excellent electrical conductivity performance allows the silver patterns or structures to be made into a variety of electronic devices, such as capacitors, integrated circuits, semiconductors, rigid or soft robotics and electrical sensors.

Room temperature processing. Compared to other patterning technologies that require high temperature environment, metal patterning techniques according to embodiments are processed under room temperature and show great superiority in extending the choice for substrates to a broad variety of materials, especially flexible materials with low glass transition temperature. The excellent compatibility of embodiments with flexible substrates serves as the basis for further development of soft electronic devices.

High energy efficiency by using visible light, rather than often used UV light (relatively higher energy input than visible light). Most of the current photolithographic methods employ UV light in order to obtain sufficient energy input for the reaction or curing of the resin or patterned materials. In comparison, embodiments are facile and operate by the reduction of metal with easily obtainable visible light, such as daily light sources and optical parts (e.g. lenses) at much lower cost.

Fast fabrication. In embodiments the metal patterns are fabricated as a whole instead of in serial, which indicates that much time will be saved especially when dealing with large patterns. Furthermore, the printing speed is tunable and customizable by controlling the light source intensity, converging lens and optical setups, as well as the active chemical concentration in the printing solutions.

Scalable from μm to m level. In embodiments the metal pattern is determined solely by the light pattern projected. In other words, the size and resolution of the printed pattern can be conveniently controlled by the light pattern into arbitrarily unlimited sizes in principle.

Simple setup and low cost. Besides the low-cost white light, the metal patterning or 3D structure fabrication according to embodiments can be achieved using commercially available projectors, without special design and assembly of complex setups or using digital light projecting and complex computer programming.

It should be understood that the above steps are provided as exemplary; other steps or the order of the steps may be altered (as will be understood) without departing from the scope of the disclosure. The person skilled in the art will recognize that additional embodiments according to the invention are contemplated as being within the scope of the foregoing generic disclosure, and no disclaimer is in any way intended by the foregoing, non-limiting examples.

EXEMPLARY EMBODIMENTS

Although the following embodiments provide details on certain embodiments of the inventions, it should be understood that these are only exemplary in nature, and are not intended to limit the scope of the invention.

Example 1

Generating Silver Patterns on a Substrate

Introduction: Embodiments demonstrate that silver citrate can be easily reduced to metallic silver under the exposure of white light from a commercial projector with the following procedure.

Methods: In these embodiments silver ink is prepared by mixing silver nitrate, sodium citrate and sodium nitrate. Here, silver nitrate and sodium citrate are mixed to generate silver citrate, which is the effective component being decomposed to metallic silver when irradiated with white light. Sodium nitrate enhances solubility of silver citrate due to the salt effect, which affects the ionic strength of the solution and hence on activity coefficients, so that the equilibrium constant, expressed as a concentration quotient, changes. The light source is provided by a commercial projector in this example. Light patterns are designed by Microsoft PowerPoint and are converted to an optical signal by projector. Light patterns or images are converged by a convex lens and aligned by a reflective mirror to and make the focus onto the plane of substrate. The size of the projected images was tuned by using convex lens of different focal lengths.

Conclusion: Embodiments allow for a quick method to allow deposition of sliver onto a substrate of choice.

Example 2

Testing Mechanical Properties of Printed Patterns

Introduction: Various embodiments demonstrate robust mechanical properties that are beneficial for possible uses, including resistance change upon bending and the electrical stability after cyclic mechanical deformation of the flexible silver pattern.

Methods: Silver electrodes (≈90 nm thickness) were printed on a soft PET substrate (100 μm thick) and the electrical resistance changes upon outward and inward bending were respectively tested. By bending the sample outward at different bending radius from 22.9 mm down to 0.1 mm (fully folded), the resistance can be well controlled to increase ($R/R_0$ increased from 1.05 to 2.62) with decreasing bending radius (FIG. 10A) due to the particle packing level variation of the silver electrode under stretching. Alternatively, by bending the sample inward, the electrical resistance decreased ($R/R_0$ decreased from 1.00 to 0.72) with decreasing bending radius because of the denser particles packing under compression. When the silver patterns were flattened after bending, the resistance could recover to the original state. The resistance of the silver patterns stayed constant for 4000 cycles of repetitive outward bending at 7.7 mm bending radius (FIG. 10B), which demonstrates excellent fatigue resistance of the printed patterns.

DOCTRINE OF EQUIVALENTS

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the foregoing examples and descriptions of various preferred embodiments of the present invention are merely illustrative of the invention as a whole, and that variations in the components or steps of the present invention may be made within the spirit and scope of the invention. Accordingly, the present invention is not limited to the specific embodiments described herein, but, rather, is defined by the scope of the appended claims.

What is claimed is:

1. A method for printing metal patterns comprising:
immersing a substrate into a bath of photosensitive metal ink, wherein the photo sensitive metal ink comprises an aqueous solution including a decomposable organic silver salt or a decomposable inorganic silver salt; and
while the substrate is immersed in the bath of photosensitive metal ink, focusing an emission of a light source through a light patterning structure onto at least a portion of the substrate such that a patterned design of light is projected thereon;
wherein the emission has a wavelength such that a metal ion reduction reaction is initiated in the photosensitive metal ink at the portion of the substrate onto which the patterned design of light is projected such that the metal ink is decomposed to form and dispose a metal pattern on the substrate, said metal pattern being identical in conformation to the patterned design of light.

2. The method of claim 1, wherein the light source is one of either monochromatic or polychromatic and spans a specified wavelength range of light.

3. The method of claim 1, wherein the light patterning structure is selected from the group consisting of a projector, a digital micromirror device (DMD), liquid-crystal display (LCD), and a digital light processing (DLP) apparatus.

4. The method of claim 1 further comprising one or more optical elements disposed between the light source and the substrate selected from the group consisting of light convergent, divergent, and collimating elements.

5. The method of claim 1, wherein organic silver salt or the inorganic silver salt is decomposable to form a metal element under the exposure of the emission.

6. The method of claim 1, wherein the organic silver salt or the inorganic salt is selected from the group of silver citrate, silver acetate, and modified Tollens' reagent.

7. The method of claim 6, wherein the photosensitive metal ink further comprises an additive component disposed within the photosensitive metal ink selected from the group of inorganic salts, and silver nanoseeds.

8. The method of claim 1, wherein the substrate is polyethylene terephthalate.

9. The method of claim 1, wherein the substrate is pretreated with aminopropyltriethoxysilane.

10. The method of claim 1 further comprising annealing the metal pattern is using a material selected from the group of calcium chloride, calcium nitrate, sodium chloride, and sodium nitrate.

11. An apparatus for printing metal patterns comprising:
a substrate;
a light source for producing an emission;
a light patterning structure in optical alignment between the light source and the substrate such that the emission forms a patterned design of light on the substrate; and
a reservoir of a photosensitive metal ink comprising an aqueous solution including a decomposable organic silver salt or a decomposable inorganic silver salt in moving relation relative to the substrate such that at least the portion of the substrate having the patterned design of light projected thereon is immersed within the reservoir;
wherein the emission has a wavelength such that when the substrate is immersed in the reservoir a metal ion reduction reaction is initiated in the photosensitive metal ink at the portion of the substrate onto which the patterned design of light is projected such that the metal ink is decomposed to form and dispose a metal pattern on the substrate, said metal pattern being identical in conformation to the patterned design of light.

12. The apparatus of claim 11, wherein the light source is one of either monochromatic or polychromatic and spans a specified wavelength range of light.

13. The apparatus of claim 11, wherein the light patterning structure is selected from the group consisting of a projector, a digital micromirror device (DMD), liquid-crystal display (LCD), and a digital light processing (DLP) apparatus.

14. The apparatus of claim 11 further comprising one or more optical elements disposed between the light source and the substrate selected from the group consisting of light convergent, divergent, and collimating elements.

15. The apparatus of claim 11, wherein the photosensitive metal ink is one or more organic or inorganic metal salts decomposable to form a metal element under the exposure of the emission.

16. The apparatus of claim 11, wherein the photosensitive metal ink is selected from the group of silver citrate, silver acetate, and modified Tollens' reagent.

17. The apparatus of claim 16, wherein the photosensitive metal ink further comprises an additive component disposed within the photosensitive metal ink selected from the group of inorganic salts, and silver nanoseeds.

18. The apparatus of claim 11, wherein the substrate is polyethylene terephthalate.

19. The apparatus of claim 11, wherein the substrate is pretreated with aminopropyltriethoxysilane.

* * * * *